US009910359B2

(12) United States Patent
Deguenther et al.

(10) Patent No.: US 9,910,359 B2
(45) Date of Patent: Mar. 6, 2018

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Markus Deguenther, Aalen (DE); Vladimir Davydenko, Bad Herrenalb (DE); Thomas Korb, Schwaebisch Gmuend (DE); Frank Schlesener, Oberkochen (DE); Stefanie Hilt, Aalen (DE); Wolfgang Hoegele, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/086,475

(22) Filed: Mar. 31, 2016

(65) Prior Publication Data
US 2016/0209759 A1 Jul. 21, 2016

Related U.S. Application Data

(63) Continuation of application No. PCT/EP2014/003049, filed on Nov. 13, 2014.

(30) Foreign Application Priority Data

Nov. 22, 2013 (EP) ..................................... 13194135

(51) Int. Cl.
G03F 7/20 (2006.01)
G02B 26/08 (2006.01)
(52) U.S. Cl.
CPC ..... *G03F 7/70058* (2013.01); *G02B 26/0833* (2013.01); *G03F 7/70066* (2013.01);
(Continued)

(58) Field of Classification Search
None
See application file for complete search history.

(56) References Cited

U.S. PATENT DOCUMENTS 7,061,582 B2 6/2006 Zinn et al.
2004/0057034 A1* 3/2004 Zinn .................. G03F 7/70116
355/67
(Continued)

FOREIGN PATENT DOCUMENTS

EP 1 262 836 A1 12/2002
JP 2013-048235 3/2013
(Continued)

OTHER PUBLICATIONS

Korea Office Action, with translation thereof, for KR Appl No. 10-2014-0163298, dated Mar. 9, 2016.
(Continued)

*Primary Examiner* — Steven H Whitesell Gordon
(74) *Attorney, Agent, or Firm* — Fish & Richardson P.C.

(57) ABSTRACT

An illumination system of a microlithographic projection exposure apparatus includes a pupil forming unit directing light on a spatial light modulator that transmits or reflects impinging light in a spatially resolved manner. An objective images a light exit surface of the spatial light modulator on light entrance facets of an optical integrator so that an image of an object area on the light exit surface completely coincides with one of the light entrance facets. The pupil forming unit and the spatial light modulator are controlled so that the object area is completely illuminated by the pupil forming unit and projection light associated with a point in the object area is at least partially and variably prevented from impinging on the one of the light entrance facets.

27 Claims, 14 Drawing Sheets

(52) U.S. Cl.
CPC ...... *G03F 7/70075* (2013.01); *G03F 7/70116* (2013.01); *G03F 7/70191* (2013.01); *G03F 7/70425* (2013.01)

(56) References Cited

U.S. PATENT DOCUMENTS

| | | |
|---|---|---|
| 2006/0087634 A1 | 4/2006 | Brown et al. |
| 2007/0165202 A1* | 7/2007 | Koehler .................. G03F 7/702 355/67 |
| 2009/0021716 A1* | 1/2009 | Wangler ............. G03F 7/70075 355/67 |
| 2009/0091730 A1* | 4/2009 | Tanaka ............... G03F 7/70291 355/67 |
| 2009/0097007 A1* | 4/2009 | Tanaka ............... G03F 7/70075 355/67 |
| 2009/0097094 A1* | 4/2009 | Tanaka ............... G03F 7/70075 359/239 |
| 2009/0109417 A1* | 4/2009 | Tanitsu .............. G02B 27/0927 355/67 |
| 2009/0115990 A1* | 5/2009 | Owa .................. G02B 26/0833 355/71 |
| 2009/0116093 A1* | 5/2009 | Tanitsu ............. G02B 26/0833 359/239 |
| 2009/0117494 A1* | 5/2009 | Owa ................... G03F 7/70116 430/322 |
| 2009/0122290 A1 | 5/2009 | Van Dam |
| 2009/0135392 A1* | 5/2009 | Muramatsu ......... G03F 7/70116 355/67 |
| 2010/0157269 A1 | 6/2010 | Deguenther et al. |
| 2011/0001947 A1* | 1/2011 | Dinger ................... G02B 26/06 355/67 |
| 2011/0122388 A1 | 5/2011 | Deguenther |
| 2011/0211183 A1* | 9/2011 | Tanitsu ............... G03F 7/70116 355/67 |
| 2013/0044301 A1 | 2/2013 | Zlatanov et al. |
| 2013/0050800 A1 | 2/2013 | Maeda et al. |
| 2013/0148092 A1 | 6/2013 | Wangler et al. |
| 2013/0293861 A1 | 11/2013 | Deguenther |

FOREIGN PATENT DOCUMENTS

| | | |
|---|---|---|
| WO | WO 02/075440 | 9/2002 |
| WO | WO 2005/026843 A2 | 3/2005 |
| WO | WO 2010/006687 A1 | 1/2010 |
| WO | WO 2012100791 A1 * | 8/2012 ......... G03F 7/70191 |

OTHER PUBLICATIONS

Korea Office Action, with translation thereof, for KR Appl No. 10-2014-0162782, dated Mar. 15, 2016.
International Search Report and Written Opinion for corresponding PCT Appl No. PCT/EP2014/003049, dated Feb. 25, 2015.

* cited by examiner

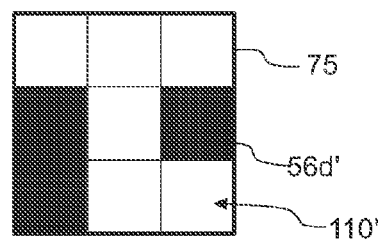
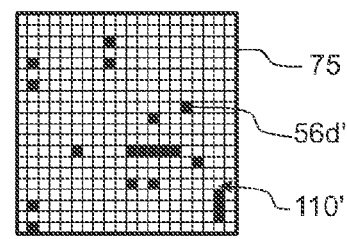
Fig. 12  Fig. 14
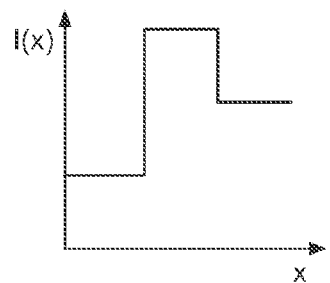
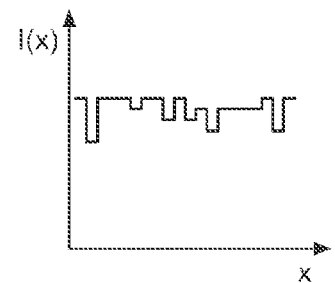
Fig. 13  Fig. 15
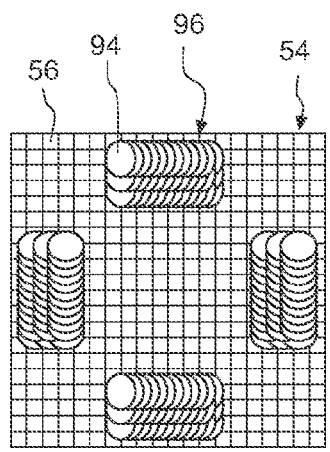
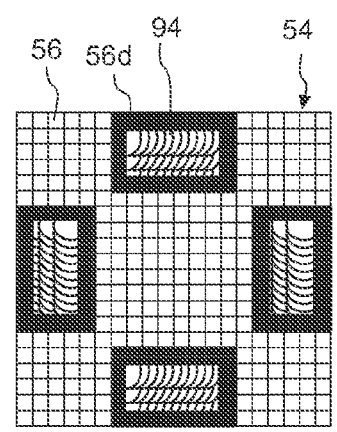
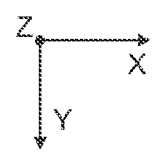
Fig. 16  Fig. 17

ILLUMINATION SYSTEM OF A MICROLITHOGRAPHIC PROJECTION EXPOSURE APPARATUS

CROSS-REFERENCE TO RELATED APPLICATION

The present application is a continuation of, and claims benefit under 35 USC 120 to, international application PCT/EP2014/003049, filed Nov. 13, 2014, which claims benefit under 35 USC 119 of European Application No. 13194135.3, filed Nov. 22, 2013. The entire disclosure of international application PCT/EP2014/003049 and European Application No. 13194135.3 are incorporated by reference herein.

FIELD

The disclosure generally relates to illumination systems for illuminating a mask in microlithographic exposure apparatus, and in particular to such systems including an optical integrator configured to produce a plurality of secondary light sources in a pupil plane. The disclosure also relates to a method of operating such illumination systems.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component. A projection exposure apparatus typically includes a light source, an illumination system that illuminates the mask with projection light produced by the light source, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning mechanism. Commonly used masks contain opaque or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

As the technology for manufacturing microstructured devices advances, there are ever increasing demands also on the illumination system. Ideally, the illumination system illuminates each point of the illuminated field on the mask with projection light having a well defined spatial and angular irradiance distribution. The term angular irradiance distribution describes how the total light energy of a light bundle, which converges towards a particular point in the mask plane, is distributed among the various directions of the rays that constitute the light bundle.

The angular irradiance distribution of the projection light impinging on the mask is usually adapted to the kind of pattern to be projected onto the photoresist. Often the angular irradiance distribution depends on the size, orientation and pitch of the features contained in the pattern. The most commonly used angular irradiance distributions of projection light are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. In the simplest case a stop (diaphragm) including one or more apertures is positioned in a pupil plane of the illumination system. Since locations in a pupil plane translate into angles in a Fourier related field plane such as the mask plane, the size, shape and location of the aperture(s) in the pupil plane determines the angular irradiance distributions in the mask plane. However, any change of the illumination setting involves a replacement of the stop. This makes it difficult to finely adjust the illumination setting, because this would involve a very large number of stops that have aperture(s) with slightly different sizes, shapes or locations. Furthermore, the use of stops inevitably results in light losses and thus in a reduced throughput of the apparatus.

Many common illumination systems therefore include adjustable elements that make it possible, at least to a certain extent, to continuously vary the illumination of the pupil plane. Many illumination systems use an exchangeable diffractive optical element to produce a desired spatial irradiance distribution in the pupil plane. If zoom optics and a pair of axicon elements are provided between the diffractive optical element and the pupil plane, it is possible to adjust this spatial irradiance distribution.

Recently it has been proposed to use mirror arrays that illuminate the pupil plane. In EP 1 262 836 A1 the mirror array is realized as a micro-electromechanical system (MEMS) including more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil plane translates the reflection angles produced by the mirrors into locations in the pupil plane. This known illumination system makes it possible to illuminate the pupil plane with a plurality of spots, wherein each spot is associated with one particular microscopic mirror and is freely movable across the pupil plane by tilting this mirror.

Similar illumination systems are known from US 2006/0087634 A1, U.S. Pat. No. 7,061,582 B2, WO 2005/026843 A2 and WO 2010/006687 A1. US 2010/0157269 A1 discloses an illumination system in which an array of micromirrors is directly imaged on the mask.

As mentioned further above, it is usually desired to illuminate, at least after scan integration, all points on the mask with the same irradiance and angular irradiance distribution. If points on the mask are illuminated with different irradiances, this usually results in undesired variations of the critical dimension (CD) on wafer level. For example, in the presence of irradiance variations the image of a uniform line on the mask on the light sensitive may also have irradiance variations along its length. Because of the fixed exposure threshold of the resist, such irradiance variations directly translate into widths variations of a structure that shall be defined by the image of the line.

If the angular irradiance distribution varies over the illuminated field on the mask, this also has a negative impact on the quality of the image that is produced on the light sensitive surface. For example, if the angular irradiance distribution is not perfectly balanced, i.e more light impinges from one side on a mask point than from the opposite side, the conjugate image point on the light sensitive surface will be laterally shifted if the light sensitive surface is not perfectly arranged in the focal plane of the projection objective.

For modifying the spatial irradiance distribution in the illumination field U.S. Pat. No. 6,404,499 A and US 2006/0244941 A1 propose mechanical devices that include two opposing arrays of opaque finger-like stop elements that are arranged side by side and aligned parallel to the scan direction. Each pair of mutually opposing stop elements can be displaced along the scan direction so that the distance between the opposing ends of the stop elements is varied. If this device is arranged in a field plane of the illumination system that is imaged by an objective on the mask, it is possible to produce a slit-shaped illumination field whose width along the scan direction may vary along the cross-scan direction. Since the irradiance is integrated during the scan process, the integrated irradiance (sometimes also referred to as illumination dose) can be finely adjusted for a plurality of cross-scan positions in the illumination field.

Unfortunately these devices are mechanically very complex and expensive. This is also due to the fact that these devices have to be arranged in or very close to a field plane in which usually the blades of a movable field stop is arranged.

Adjusting the angular irradiance distribution in a field dependent manner is more difficult. This is mainly because the spatial irradiance distribution is only a function of the spatial coordinates x, y, whereas the angular irradiance distribution also depends on the angles $\alpha$, $\beta$.

WO 2012/100791 A1 discloses an illumination system in which a first mirror array is used to produce a desired irradiance distribution in the pupil plane of the illumination system. In close proximity to the pupil plane an optical integrator is arranged that has a plurality of light entrance facets. Thus images of the light entrance facets are superimposed on the mask. The light spots produced by the mirror array have an area that is at least five times smaller than the total area of the light entrance facets. Thus it is possible to produce variable light patterns on the light entrance facets. In this manner different angular irradiance distributions can be produced on different portions of the illumination field. It is thus possible, for example, to produce an X dipole and a Y dipole illumination setting at a given time in the illumination field.

In order to ensure that the portions with different illumination settings are sharply delimited, it is proposed to use a second mirror array configured as a digital mirror device (DMD). This second mirror array is illuminated by the first mirror array and is imaged on the light entrance facets by an objective. By bringing larger groups of micromirrors of the second mirror array in an "off"-state, it is possible to produce irradiance distributions on the light entrance facets that have sharp boundaries.

However, it turned out that it is difficult to produce so many and so small freely movable light spots with the first mirror array. Furthermore, this prior art illumination system is mainly concerned with producing completely different illumination settings at different portions in the illumination field. For that reason the light entrance facets are usually not completely, but only partially illuminated.

SUMMARY

The present disclosure seeks to provide an illumination system of a microlithographic projection exposure apparatus which is capable of adjusting both the spatial and the angular irradiance distribution in a field dependent manner. This means that it shall be possible to adjust the irradiance and angular irradiance distribution at different points in the illumination field differently.

In an aspect, the disclosure provides an illumination system including a pupil plane, a mask plane in which a mask to be illuminated by projection light can be arranged, and an optical integrator. The latter is configured to produce a plurality of secondary light sources located in the pupil plane. The optical integrator includes a plurality of light entrance facets each being associated with one of the secondary light sources. Images of the light entrance facets at least substantially superimpose in the mask plane. The illumination system further includes a spatial light modulator that has a light exit surface and is configured to transmit or to reflect impinging projection light in a spatially resolved manner, a pupil forming unit that is configured to direct projection light on the spatial light modulator, and an objective that images the light exit surface of the spatial light modulator onto the light entrance facets of the optical integrator so that an image of an object area on the light exit surface completely coincides with one of the light entrance facets. A control unit is configured to control the pupil forming unit and the spatial light modulator so that the object area is completely illuminated by the pupil forming unit and projection light associated with a point in the object area is at least partially and variably prevented from impinging on the one of the light entrance facets.

The disclosure is based on the perception that instead of using a spatial light modulator only for producing sharp edges of an irradiance distribution on the light entrance facets, it may also be used to modify the irradiance distribution if the object area imaged on a light entrance facet is completely illuminated so that there would be no need for sharp edges.

With the spatial light modulator controlled in the manner described above it is possible to dispense with mechanical complex devices that are used in prior art illumination systems to adjust the spatial irradiance distribution along the cross-scan direction, and simultaneously to flexibly adjust the angular irradiance distribution at mask level in a field dependent manner. Since the geometrical optical flux is small in front of the optical integrator, the objective that images the light exit surface of the spatial light modulator on the light entrance facets can be realized with very few and preferably spherical lenses.

Since all components of the illumination system may be purely reflective, the disclosure can principally also be used in EUV illumination systems.

The pupil forming unit may include a diffractive optical element for defining an irradiance distribution on the spatial light modulator that is imaged on the light entrance facets of the optical integrator. For fine adjustments of this irradiance distribution zoom optics and/or a pair of axicon elements may be arranged in the light path between the diffractive optical element and the spatial light modulator.

A more flexible setting of the irradiance distribution on the spatial light modulator is possible if the pupil forming unit includes a first beam deflection array of first reflective or transparent beam deflection elements. Each beam deflection element is configured to illuminate a spot on the spatial light modulator at a position that is variable by changing a deflection angle produced by the beam deflection element.

The spatial light modulator may be of the transparent or the reflective type and may includes an array of elements that can be used to attenuate, completely block or deflect impinging light. For example, the spatial light modulator may be configured as an LCD panel including a two dimensional array of LCD cells whose optical activity can be controlled individually by the control unit. In modulators of the transparent type the object area is usually illuminated from its back side.

In one embodiment the spatial light modulator includes a second beam deflection array of second reflective or transparent beam deflection elements. Each second beam deflection element is capable to be in an "on"-state, in which it directs impinging light towards the optical integrator, and in an "off"-state, in which it directs impinging light elsewhere, for example on a light absorbing surface. Such a second beam deflection array may be configured as a digital mirror device which may include millions of individual micromirrors.

Generally the larger the number of second beam deflection elements arranged in the object area is, the better is the spatial resolution of the field dependent adjustment of the irradiance and angular irradiance distribution. Preferably at least 10, and even more preferably at least 50, second beam deflection elements are arranged in the object area.

In one embodiment center of adjacent second beam deflection elements arranged in the object area are aligned along a straight line. An image of the straight line forms an angle $\alpha$ to a boundary line of the one of the light entrance facets, wherein a is distinct from m·45° with m=0, 1, 2, 3, . . . . With such an oblique arrangement of the second beam deflection array with respect to the light entrance facets the distance is reduced between cross-scan positions in the illumination field at which the attenuation is different.

For example, the boundaries of the second beam deflection elements may be arranged in a first rectangular grid, and boundaries of the light entrance facets may be arranged in a second rectangular grid. Then the image of the first rectangular grid formed on the light entrance facets forms the angle $\alpha$ to the second rectangular grid.

If the mask moves along a scan direction while it is illuminated by the illumination system, the irradiance and angular irradiance distribution at a point on the mask is obtained by integrating the irradiances and angular irradiance distributions during the scan process, i.e. while the point on the mask moves through the illumination field. For that reason it may be sufficient to provide only a few second beam deflection elements along the scan direction, but a larger number of second beam deflection elements along the cross-scan direction in order to ensure that the field dependence of the irradiance and angular irradiance distribution can be finely adjusted. This usually implies that a length of the object area along the first direction should be larger than a length of the object area along a second direction which is orthogonal to the first direction. Then the objective should be an anamorphotic objective having a magnification M with |M| being smaller along the first direction than along the second direction. The anamorphotic objective ensures that the image of the elongated object area is not elongated, but coincides with the (usually square) shape of the light entrance facets.

Instead of or in addition to using an anamorphotic objective, it is possible to use an anamorphotic condenser having a front focal plane which coincides with the pupil plane and having a focal length f being shorter along the first direction than along the second direction.

Generally it is preferred if the second beam deflection elements are arranged in an object plane of the objective that is parallel to a plane in which the light entrance facets are arranged. This can be achieved if the second beam deflection elements are configured such that they produce in the "on"-state a deflection of impinging light by an angle distinct from zero. Additionally or alternatively the objective may be non-telecentric on an object side and telecentric on an image side.

Generally the light spots produced by the first beam deflection array on the object area will be larger than the object area. However, the disclosure may also be used if the spots are smaller than the object area.

Since gaps between second beam deflection elements are, via the light entrance facets of the optical integrator, eventually imaged on the illumination field, measures should be taken that this does not compromise the uniformity of the spatial and angular irradiance distribution in the illumination field. To this end a scattering plate may be arranged in a light path between the optical light modulator and the mask plane, preferably close to a field plane. The scattering plate blurs the irradiance distribution on the light entrance facets and thus ensures that no dark lines occur in the illumination field.

If the object area on the light exit surface of the optical light modulator is considered as an active object area so that projection light associated with a point in the active object area can be prevented from impinging on the one of the light entrance facets, the spatial light modulator may include another object area that is a passive object area so that projection light associated with a point in the passive object area cannot be prevented from impinging on the one of the light entrance facets. Such a combination of active and passive object areas may be expedient particularly in those cases in which the spatial resolution produced by the optical light modulator in an active object area shall be very high. If the optical light modulator is configured as a digital mirror device, for example, this would involve a huge number of micromirrors because also the number of light entrance facets is usually large. Digital mirror devices with such a huge number of micromirrors may not yet be easily available. For that reason it may be expedient to assemble the optical light modulator from smaller active object areas, for example formed by conventional digital mirror devices, and passive object areas, for example realized as plane mirrors, in between. Such an arrangement may be useful because often it is not necessary to modify the irradiance distribution on every light entrance facet, but only on some of them.

In order maintain the pole balance, the irradiance produced on the spatial light modulator by the pupil forming unit may be higher on the active object area than on the passive object area. This higher irradiance compensates light losses that are caused by preventing light from reaching the light entrance facets.

Preferably the passive object areas and the active object areas are arranged point-symmetrically to each other with respect to an optical axis of the illumination system. This ensures that the energetic balance (telecentricity) of the light bundles converging to points on the mask can always be adjusted. Then roughly one half of the total area of the light exit surface may be covered by active object areas and the other half by passive object areas.

If the light exit surface of the optical light modulator includes groups of object areas that are separated by areas that are not imaged on the light entrance facets, the objective may be configured to combine images of the active object areas so that the images of the object areas abut on the light entrance facets.

In particular the objective may include a first array of first optical elements, wherein each first optical element forms a magnified image of one of the object areas in an intermediate image plane, and imaging optics that image the intermediate image plane on the light entrance facets.

Subject of the disclosure is also a method of operating an illumination system of a microlithographic projection exposure apparatus, including the following steps:
a) producing an irradiance distribution of projection light on a spatial light modulator that has a light exit surface and is configured to transmit or to reflect impinging projection light in a spatially resolved manner, wherein the light exit surface includes an object area that is completely illuminated by projection light;
b) imaging the object area on the light exit surface on a light entrance facet of an optical integrator so that an image of the object area completely coincides with the light entrance facet;
c) controlling the spatial light modulator so that projection light associated with a point in the object area (110) is at least partially prevented from impinging on the light entrance facet.

Subject of the disclosure is also another method of operating an illumination system of a microlithographic projection exposure apparatus, including the following steps:
a) completely illuminating an object area (110) on a spatial light modulator (52);
b) imaging the object area (110) on a light entrance facet (75) of an optical integrator (60);
c) preventing that all light associated with a point in the object area impinges on the light entrance facet.

Definitions

The term "light" is used herein to denote any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote all light that passes through a particular lens or another optical element.

The term "position" is used herein to denote the location of a reference point of a body in the three-dimensional space. The position is usually indicated by a set of three Cartesian coordinates. The orientation and the position therefore fully describe the placement of a body in the three-dimensional space.

The term "surface" is used herein to denote any plane or curved surface in the three-dimensional space. The surface may be part of a body or may be completely separated therefrom, as it is usually the case with a field or a pupil plane.

The term "field plane" is used herein to denote the mask plane or any other plane that is optically conjugate to the mask plane.

The term "pupil plane" is a plane in which (at least approximately) a Fourier relationship is established to a field plane. Generally marginal rays passing through different points in the mask plane intersect in a pupil plane, and chief rays intersect the optical axis. As usual in the art, the term "pupil plane" is also used if it is in fact not a plane in the mathematical sense, but is slightly curved so that, in the strict sense, it should be referred to as pupil surface.

The term "uniform" is used herein to denote a property that does not depend on the position.

The term "optical raster element" is used herein to denote any optical element, for example a lens, a prism or a diffractive optical element, which is arranged, together with other identical or similar optical raster elements so that each optical raster element is associated with one of a plurality of adjacent optical channels.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, $\bar{y}$ Diagram", Applied Optics, 1963, vol. 2, no. 12, pages 1251-1256.

The term "field dependence" is used herein to denote any functional dependence of a physical quantity from the position in a field plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point on the surface.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha$, $\beta$ being angular coordinates describing the directions of the light rays. If the angular irradiance distribution has a field dependence, $I_a$ will be also a function of field coordinates, i.e. $I_a=I_a(\alpha,\beta,x,y)$. The field dependence of the angular irradiance distribution may be described by a set of expansion coefficients $a_{ij}$ of a Taylor (or another suitable) expansion of $I_a(\alpha,\beta,x,y)$ in x, y.

BRIEF DESCRIPTION OF THE DRAWINGS

Various features and advantages of the present disclosure may be more readily understood with reference to the following detailed description taken in conjunction with the accompanying drawings in which:

FIG. 12 illustrates an irradiance distribution on a light entrance facet of the optical integrator;

FIG. 13 is a graph showing the scan integrated irradiance distribution along the X direction produced by the light entrance facet shown in FIG. 12;

FIG. 14 illustrates another irradiance distribution on a light entrance facet of the optical integrator;

FIG. 15 is a graph showing the scan integrated irradiance distribution along the X direction produced by the light entrance facet shown in FIG. 14;

FIG. 16 is a top view on the second mirror array on which a plurality of light spots produce an irradiance distribution;

FIG. 17 shows the second mirror array of FIG. 16, but with several of the micromirrors in an "off"-state;

DESCRIPTION OF THE PREFERRED EMBODIMENTS

I. General Construction of Projection Exposure Apparatus

Figure 1:
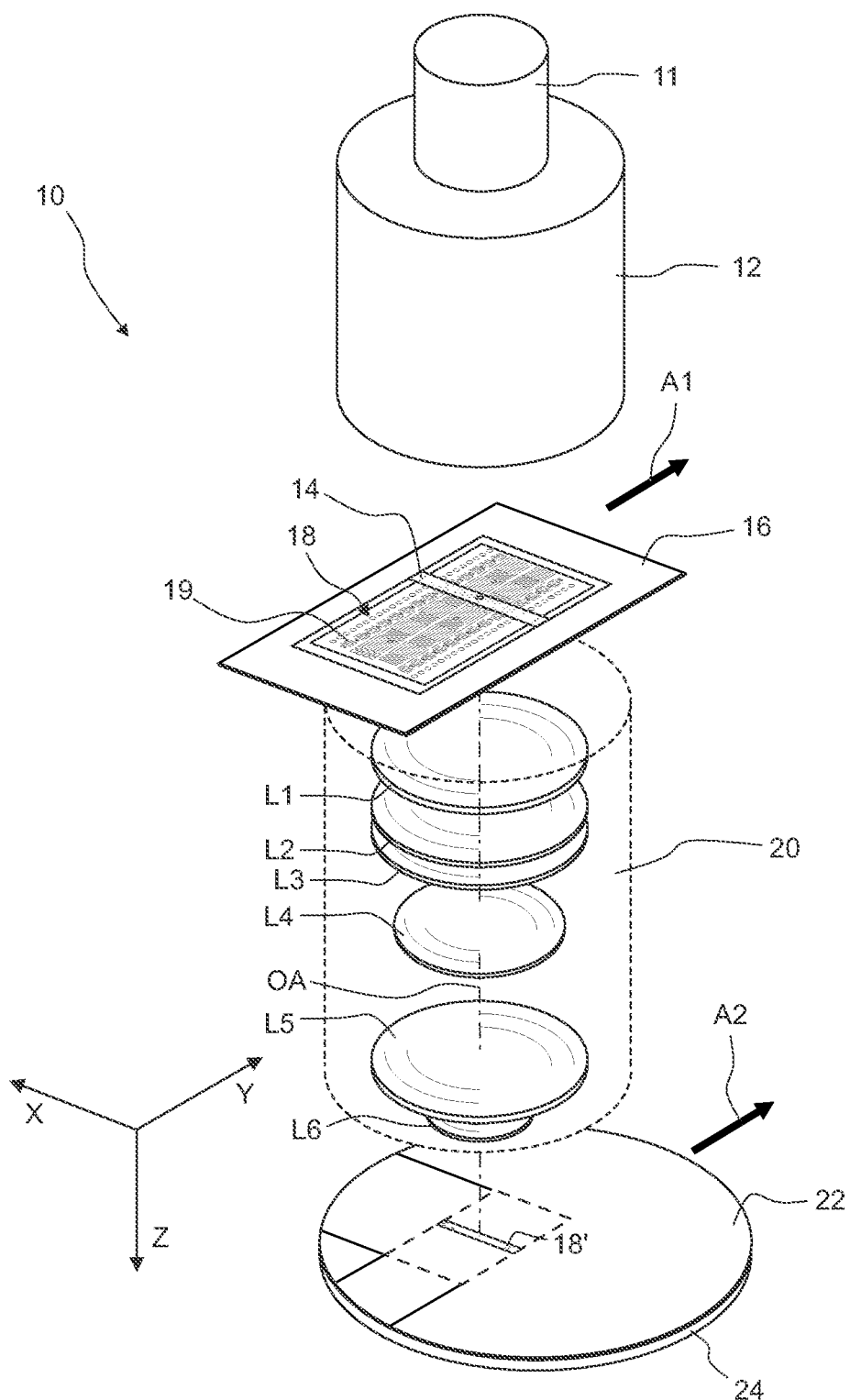
FIG. 1 is a schematic perspective view of a projection exposure apparatus in accordance with one embodiment of the present disclosure.

FIG. 1 is a perspective and highly simplified view of a projection exposure apparatus 10 in accordance with the present disclosure. The apparatus 10 includes a light source 11 that may be realized as an excimer laser, for example. The light source 11 in this embodiment produces projection light having a center wavelength of 193 nm. Other wavelengths, for example 257 nm or 248 nm, are envisaged as well.

The apparatus 10 further includes an illumination system 12 which conditions the projection light provided by the light source 11 in a manner that will be explained below in further detail. The projection light emerging from the illumination system 12 illuminates an illumination field 14 on a mask 16. The mask 16 contains a pattern 18 formed by a plurality of small features 19 that are schematically indicated in FIG. 1 as thin lines. In this embodiment the illumination field 14 has the shape of a rectangle. However, other shapes of the illuminated field 14, for example a ring segment, are also contemplated.

A projection objective 20 including lenses L1 to L6 images the pattern 18 within the illumination field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 18' of the pattern 18 within the illumination field 14 is projected onto the light sensitive layer 22.

During the projection the mask 16 and the substrate 24 move along a scan direction which corresponds to the Y direction indicated in FIG. 1. The illumination field 14 then scans over the mask 16 so that patterned areas larger than the illumination field 14 can be continuously imaged. The ratio between the velocities of the substrate 24 and the mask 16 is equal to the magnification $\beta$ of the projection objective 20. If the projection objective 20 does not invert the image ($\beta > 0$), the mask 16 and the substrate 24 move along the same direction, as this is indicated in FIG. 1 by arrows A1 and A2. However, the present disclosure may also be used in stepper tools in which the mask 16 and the substrate 24 do not move during projection of the mask.

II. Field Dependent Angular Irradiance Distribution

Figure 2:
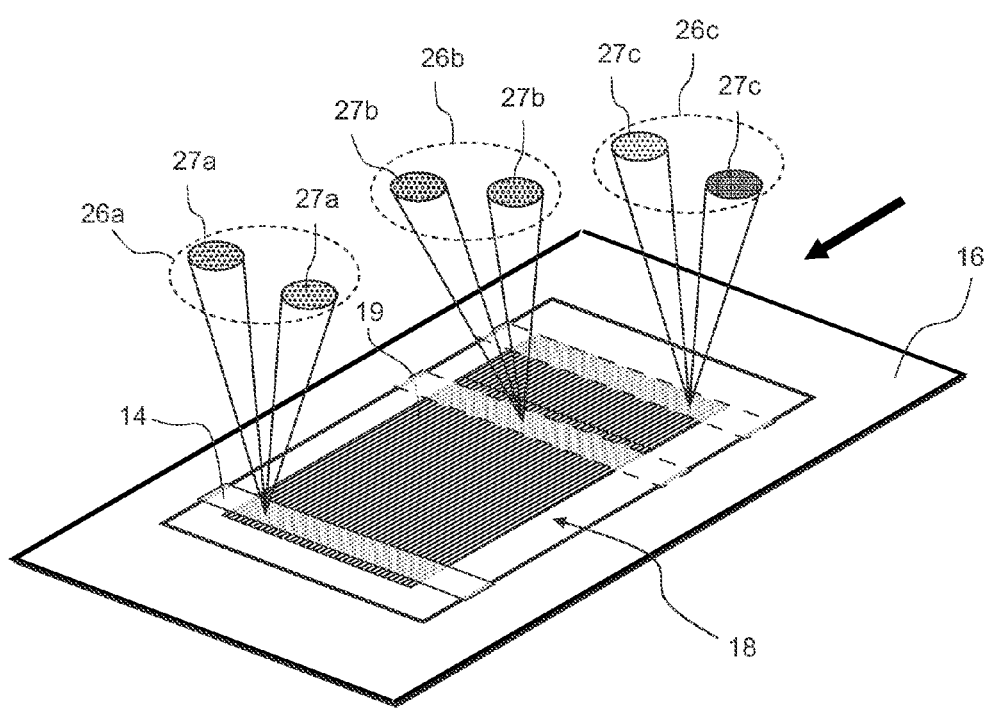
FIG. 2 is an enlarged perspective view of the mask to be projected by the projection exposure apparatus shown in FIG. 1, illustrating various deficiencies of the angular irradiance distribution.
Figure 2:
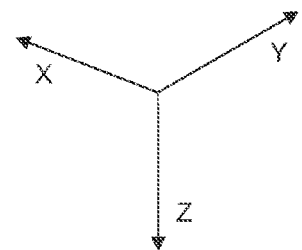

FIG. 2 is an enlarged perspective view of the mask 16 containing another exemplary pattern 18. For the sake of simplicity it is assumed that the pattern 18 includes only features 19 that extend along the Y direction. It is further assumed that the features 19 extending along the Y direction are best imaged on the light sensitive layer 22 with an X dipole illumination setting.

In FIG. 2 an exit pupil 26a associated with a light bundle is illustrated by a circle. The light bundle converges towards a field point that is located at a certain X position of the illumination field 14 at a first time during a scan cycle. In the exit pupil 26a two poles 27a, which are spaced apart along the X direction, represent directions from which projection light propagates towards this field point. The light energies concentrated in each pole 27a are assumed to be equal. Thus the projection light impinging from the +X direction has the same energy as the projection light impinging from the −X direction. Since the features 19 are assumed to be uniformly distributed over the pattern 18, this X dipole illumination setting should be produced at each field point on the mask 16.

Another exit pupil denoted by 26b is associated with a light bundle that converges towards a field point that is located at another X position of the illumination field 14 at a later time of the scan cycle. The light energies concentrated in each pole 27b are again equal. However, the light associated with the poles 27b are tilted compared to the light cones of light that are associated with the ideal pole 27a. This means that the field point receives the same amount of projection light, but the directions from which the projection light impinges on the field point are not ideal for imaging the features 19 on the light sensitive layer 22.

A further exit pupil denoted by 26c is associated with a point in the illuminated field 14 that is located at still another X position. Here it is assumed that the directions from which the projection light impinges on the field point are again ideal for imaging the features 19. Therefore also the light cones associated with the poles 27c have the same cone angle and orientation as the cones associated with the ideal exit pupil 26a. However, the poles 27c are not balanced, i.e. the light energy concentrated in the poles 27c differs from one another. Thus the projection light impinging from the +X direction has less energy than the projection light impinging from the −X direction.

From the foregoing it becomes clear that the ideal angular irradiance distribution represented by the exit pupil 26a is not obtained at each X position in the illumination field 14. The angular irradiance distribution is therefore field-dependent, i.e. at different field points the angular irradiance distribution is different.

A field dependence may not only occur along the X direction, but also along the Y direction within the illumination field 14. Then one point on the mask 16 experiences different angular irradiance distributions while it passes through the illumination field 14 during a scan cycle. If a field dependence along the Y direction (i.e. the scan direction) occurs, it has to be taken into account that the total effect for a particular field point is obtained by integrating the different angular irradiance distributions.

There is a wide variety of further field-dependent deviations of a real angular irradiance distribution from the ideal one. For example, the poles in the exit pupil associated with some field points may be deformed, blurred or may not have a desired non-uniform irradiance distribution.

If field dependent deviations from the ideal angular irradiance distribution occur, this generally has a negative impact on the quality of the pattern image that is formed on the light sensitive layer 22. In particular, the dimensions of the structures that are produced with the help of the apparatus 10 may vary inadvertently, and this may compromise the function of the devices containing these structures. Therefore it is generally desired to eliminate any field dependence of the illumination setting in the illumination field 14.

Sometimes, however, it is desirable to deliberately introduce a field dependence of the angular irradiance distribution. This may be expedient, for example, if the projection objective 20 or the mask 16 have field depending properties that affect the image of the pattern 18 on the light sensitive layer 22. Variations of the imaging properties of the projection objective 20 may occur as a result of manufacturing tolerances, aging phenomena or non-uniform temperature distributions, for example. A field dependence of the mask 16 often occurs as a result of features that have different orientations or dimensions, for example. Often field dependent adverse effects can be successfully reduced by selectively introducing a field dependence of the angular irradiance distribution. Since some of these effects change very rapidly, it is sometimes desired to change the field dependence of the angular irradiance distribution during a single scan cycle.

III. General Construction of Illumination System

Figure 3:
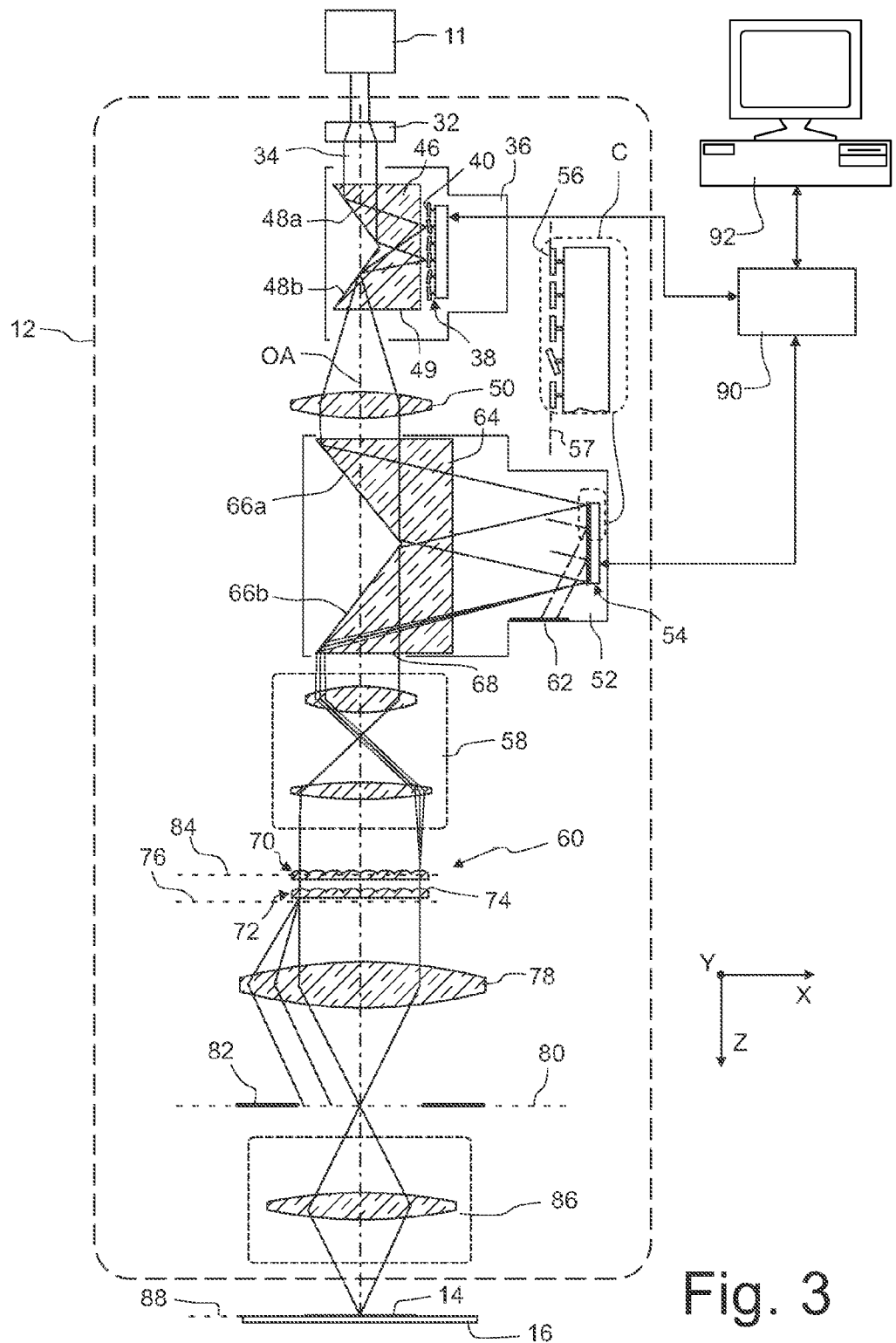
FIG. 3 is a meridional section through an illumination system being part of the apparatus shown in FIG. 1.

FIG. 3 is a meridional section through the illumination system 12 shown in FIG. 1. For the sake of clarity, the illustration of FIG. 3 is considerably simplified and not to scale. This particularly implies that different optical units are represented by one or very few optical elements only. In reality, these units may include significantly more lenses and other optical elements.

In the embodiment shown, the projection light emitted by the light source 11 enters a beam expansion unit 32 which outputs an expanded and almost collimated light beam 34. To this end the beam expansion unit 32 may include several lenses or may be realized as a mirror arrangement, for example.

Figure 4:
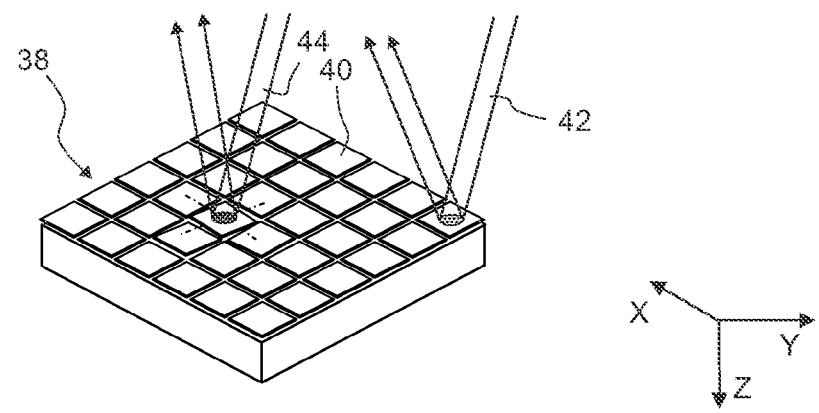
FIG. 4 is a perspective view of a first mirror array contained in the illumination system shown in FIG. 3.

The projection light beam 34 then enters a pupil forming unit 36 that is used to produce variable spatial irradiance distributions in a subsequent plane. To this end the pupil forming unit 36 includes a first mirror array 38 of very small mirrors 40 that can be tilted individually about two orthogonal axes with the help of actuators. FIG. 4 is a perspective view of the first mirror array 38 illustrating how two parallel light beams 42, 44 are reflected into different directions depending on the tilting angles of the mirrors 40 on which the light beams 42, 44 impinge. In FIGS. 3 and 4 the first mirror array 38 includes only 6×6 mirrors 40; in reality the first mirror array 38 may include several hundreds or even several thousands mirrors 40.

The pupil forming unit 36 further includes a prism 46 having a first plane surface 48a and a second plane surface 48b that are both inclined with respect to an optical axis OA of the illumination system 12. At these inclined surfaces 48a, 48b impinging light is reflected by total internal reflection. The first surface 48a reflects the impinging light towards the mirrors 40 of the first mirror array 38, and the second surface 48b directs the light reflected from the mirrors 40 towards an exit surface 49 of the prism 46. The angular irradiance distribution of the light emerging from the exit surface 49 can thus be varied by individually tilting the mirrors 40 of the first mirror array 38. More details with regard to the pupil forming unit 36 can be gleaned from US 2009/0116093 A1.

The angular irradiance distribution produced by the pupil forming unit 36 is transformed into a spatial irradiance distribution with the help of a first condenser 50. The condenser 50, which may be dispensed with in other embodiments, directs the impinging light towards a digital spatial light modulator 52 that is configured to reflect impinging light in a spatially resolved manner. To this end the digital spatial light modulator 52 includes a second mirror array 54 of micromirrors 56 that are arranged in a mirror plane 57 and can be seen best in the enlarged cut-out C of FIG. 3 and the enlarged cut-out C' of FIG. 5. In contrast to the mirrors 40 of the first mirror array 38, however, each micromirror 56 of the second mirror array 54 has only two stable operating states, namely an "on" state, in which it directs impinging light via a first objective 58 towards an optical integrator 60, and an "off" state, in which it directs impinging towards a light absorbing surface 62.

The second mirror array 54 may be realized as a digital mirror device (DMD), as they are commonly used in beamers, for example. Such devices may include up to several million micromirrors that can be switched between the two operating states many thousands times per second.

Similar to the pupil forming unit 36, the spatial light modulator 52 further includes a prism 64 having an entrance surface 65 that is arranged perpendicular to the optical axis OA and a first plane surface 66a and a second plane surface 66b that are both inclined with respect to the optical axis OA of the illumination system 12. At these inclined surfaces 66a, 66b impinging light is reflected by total internal reflection. The first surface 66a reflects the impinging light towards the micromirrors 56 of the second mirror array 54, and the second surface 66b directs the light reflected from the micromirrors 56 towards a surface 68 of the prism 64.

If all micromirrors 56 of the second mirror array 54 are in their "on" state, the second mirror array 54 has substantially the effect of a plane beam folding mirror. However, if one or more micromirrors 56 are switched to their "off" state, the spatial irradiance distribution of the light emerging from the mirror plane 57 is modified. This can be used, in a manner that will be explained further below in more detail, to produce a field dependent modification of the angular light distribution on the mask 16.

As it already has been mentioned above, the light emerging from the prism 64 passes through the first objective 58 and impinges on the optical integrator 60. Since the light passing through the first objective 58 is almost collimated, the first objective 58 may have a very low numerical aperture (for example 0.01 or even below) and thus can be realized with a few small spherical lenses. The first objective 58 images the mirror plane 57 of the spatial light modulator 52 onto the optical integrator 60.

Figure 6:
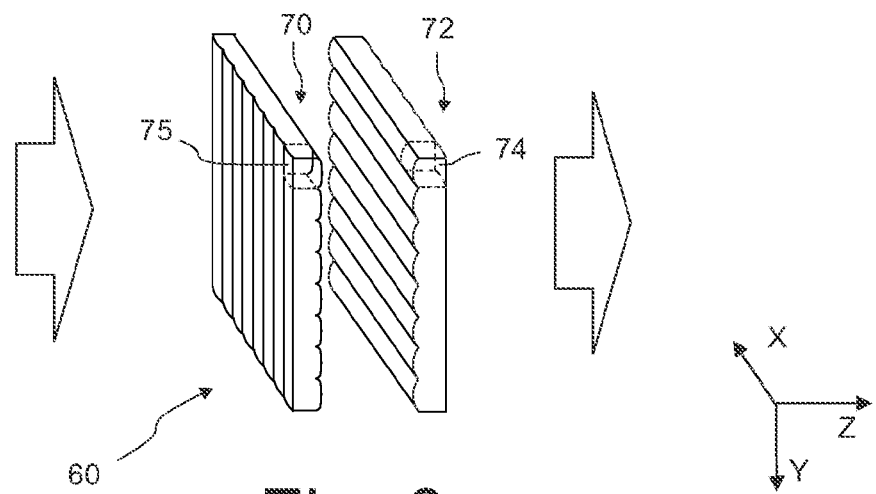
FIG. 6 is a perspective view of an optical integrator contained in the illumination system shown in FIG. 3.

The optical integrator 60 includes, in the embodiment shown, a first array 70 and a second array 72 of optical raster elements 74. FIG. 6 is a perspective view of the two arrays 70, 72. Each array 70, 72 includes, on each side of a support plate, a parallel array of cylinder lenses extending along the X and the Y direction, respectively. The volumes where two cylinder lenses cross form optical raster elements 74. Thus each optical raster element 74 may be regarded as a micro-lens having cylindrically curved surfaces. The use of cylinder lenses is advantageous particularly in those cases in which the refractive power of the optical raster elements 74 shall be different along the X and the Y direction. A different refractive power is involved if the square irradiance distribution on the optical integrator 60 shall be transformed into a slit-shaped illumination field 14, as this is usually the case. The surface of the optical raster elements 74 pointing towards the spatial light modulator 52 will be referred to in the following as light entrance facet 75.

The optical raster elements 74 of the first and second array 70, 72 respectively, are arranged one behind the other in such a way that one optical raster element 74 of the first array 70 is associated in a one to one correspondence with one optical raster element 74 of the second array 72. The two optical raster elements 74, which are associated with each other, are aligned along a common axis and define an optical channel. Within the optical integrator 60 a light beam which propagates in one optical channel does not cross or superimpose with light beams propagating in other optical channels. Thus the optical channels associated with the optical raster elements 74 are optically isolated from each other.

In this embodiment a pupil plane 76 of the illumination system 12 is located behind the second array 72; however, it may equally be arranged in front of it. A second condenser 78 establishes a Fourier relationship between the pupil plane 76 and a field stop plane 80 in which an adjustable field stop 82 is arranged.

The field stop plane 80 is optically conjugated to a raster field plane 84 which is located within or in close proximity to the light entrance facets 75 of the optical integrator 60. This means that each light entrance facet 75 in the raster field plane 84 is imaged onto the entire field stop plane 80 by the associated optical raster element 74 of the second array 72 and the second condenser 78. The images of the irradiance distribution on the light entrance facet 75 within all optical channels superimpose in the field stop plane 80, which results in its very uniform illumination of the mask 16. Another way of describing the uniform illumination of the mask 16 is based on the irradiance distribution which is produced by each optical channel in the pupil plane 76. This irradiance distribution is often referred to as secondary light source. All secondary light sources commonly illuminate the field stop plane 80 with projection light from different directions. If a secondary light source is "dark", no light impinges on the mask 16 from a (small) range of directions that is associated with this particular light source. Thus it is possible to set the desired angular light distribution on the mask 16 by simply switching on and off the secondary light sources formed in the pupil plane 76. This is accomplished by changing the irradiance distribution on the optical integrator 60 with the help of the pupil forming unit 36.

The field stop plane 80 is imaged by a second objective 86 onto a mask plane 88 in which the mask 16 is arranged with the help of a mask stage (not shown). The adjustable field stop 82 is also imaged on the mask plane 88 and defines at least the short lateral sides of the illumination field 14 extending along the scan direction Y.

The pupil forming unit 36 and the spatial light modulator 52 are connected to a control unit 90 which is, in turn, connected to an overall system control 92 illustrated as a personal computer. The control unit 90 is configured to control the mirrors 40 of the pupil forming unit 36 and the micromirrors 56 of the spatial light modulator 52 in such a manner that the angular irradiance distribution in the mask plane 88 is uniform, or a desired field dependence angular irradiance distribution is obtained.

In the following it will be described how this is accomplished.

IV. Function and Control of the Illumination System

1. Pupil Forming

Figure 7:
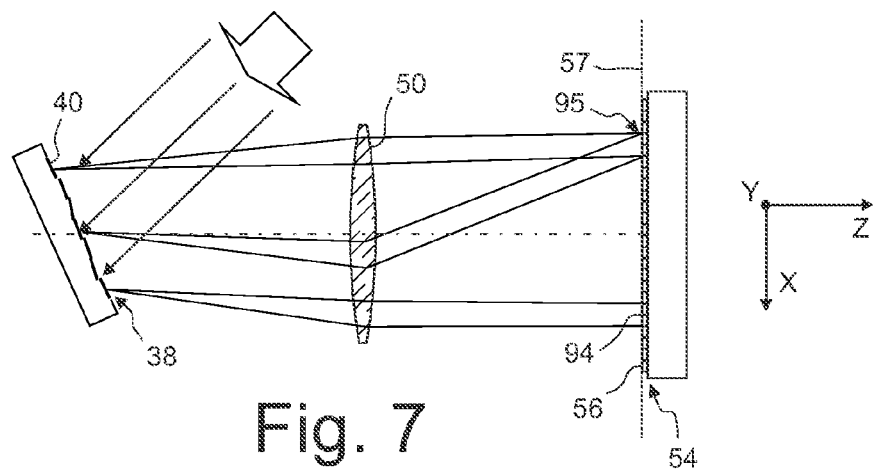
FIG. 7 is a schematic meridional section through the first and the second mirror array shown in FIGS. 4 and 5.

FIG. 7 schematically illustrates how the pupil forming unit 36 produces an irradiance distribution on the micromirrors 56 of the spatial light modulator 52. For the sake of simplicity the prisms 46, 64 are not shown.

Each mirror 40 of the first mirror array 38 is configured to illuminate a spot 94 on the mirror plane 57 of the spatial light modulator 52 at a position that is variable by changing a deflection angle produced by the respective mirror 40. Thus the spots 94 can be freely moved over the mirror plane 57 by tilting the mirrors 40 around their tilt axes. In this way it is possible to produce a wide variety of different irradiance distributions on the mirror plane 57. The spots 94 may also partly or completely overlap, as this is shown at 95. Then also graded irradiance distributions may be produced.

Figure 5:
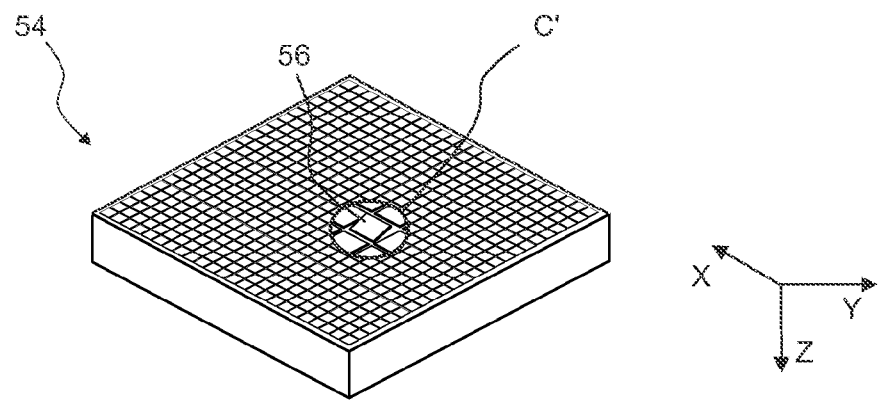
FIG. 5 is a perspective view of a second mirror array contained in the illumination system shown in FIG. 3.
Figure 8:
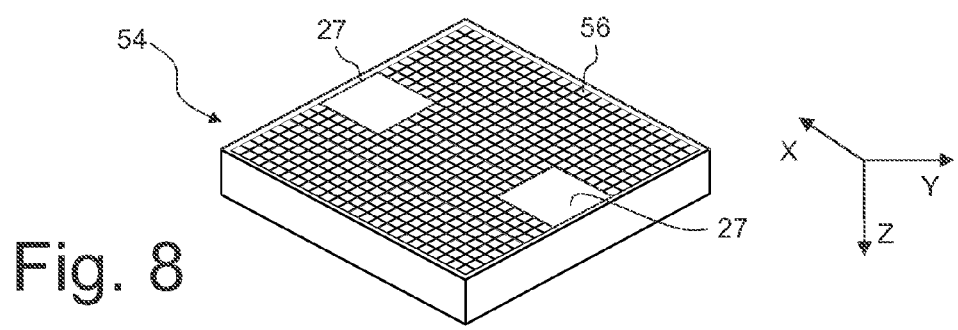
FIG. 8 is a perspective view on the second mirror array shown in FIG. 5, but illuminated with two poles.

FIG. 8 is a perspective view, similar to FIG. 5, on the second mirror array 54 contained in the spatial light modulator 52. Here it is assumed that the pupil forming unit 36 has produced an irradiance distribution on the second mirror array 54 that consists of two square poles 27 each extending exactly over 6×6 micromirrors 56. The poles 27 are arranged point-symmetrically along the X direction.

Figure 9:
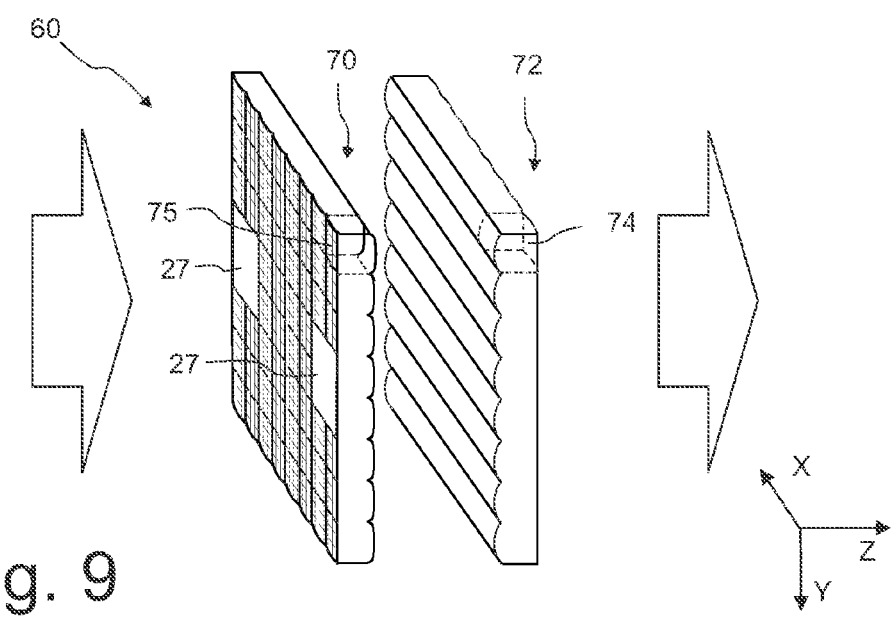
FIG. 9 is a perspective view of the optical integrator shown in FIG. 6, but illuminated with two poles.

The objective 58 forms an image of this irradiance distribution on the light entrance facets 75 of the optical integrator 60, as this is shown in FIG. 9. Here it is assumed that all micromirrors 56 are in the "on"-state so that the irradiance distribution formed on the second mirror array 54 is identically reproduced (apart from a possible scaling due to a magnification of the objective 58) on the light entrance facets 75 of the optical integrator 60. For the sake of simplicity images of gaps that separate adjacent micromirrors 56 of the second mirror array 54 are disregarded. The regular grid shown on the light entrance facets 75 represent an image of the borderlines of the micromirrors 56, but this image does not appear outside the poles 27 and is shown only in FIG. 9 for illustrative reasons.

2. Field Dependence

Since the light entrance facets 75 are located in the raster field plane 84, the irradiance distribution on the light entrance facets 75 is imaged, via the optical raster elements 74 of the second array 72 and the second condenser 78, on the field stop plane 80.

This will now be explained with reference to FIG. 10 which is an enlarged and not to scale cut-out from FIG. 3. Here only two pairs of optical raster elements 74 of the optical integrator 60, the second condenser 78 and the intermediate field stop plane 80 are shown schematically.

Two optical raster elements 74 that are associated with a single optical channel are referred to in the following as first microlens 101 and second microlens 102. The microlenses 101, 102 are sometimes referred to as field and pupil honeycomb lenses. Each pair of microlenses 101, 102 associated with a particular optical channel produces a secondary light source 106 in the pupil plane 76. In the upper half of FIG. 10 it is assumed that converging light bundles L1a, L2a and L3a illustrated with solid, dotted and broken lines, respectively, impinge on different points of the light entrance facet 75 of the first microlens 101. After having passed the two microlenses 101, 102 and the condenser 78, each light bundle L1a, L2a and L3a converges to a focal point F1, F2 and F3, respectively. From the upper half of FIG. 10 it becomes clear that points, where light rays impinge on the light entrance facet 75, and points where these light rays pass the field stop plane 80 (or any other conjugated field plane), are optically conjugate.

Figure 10:
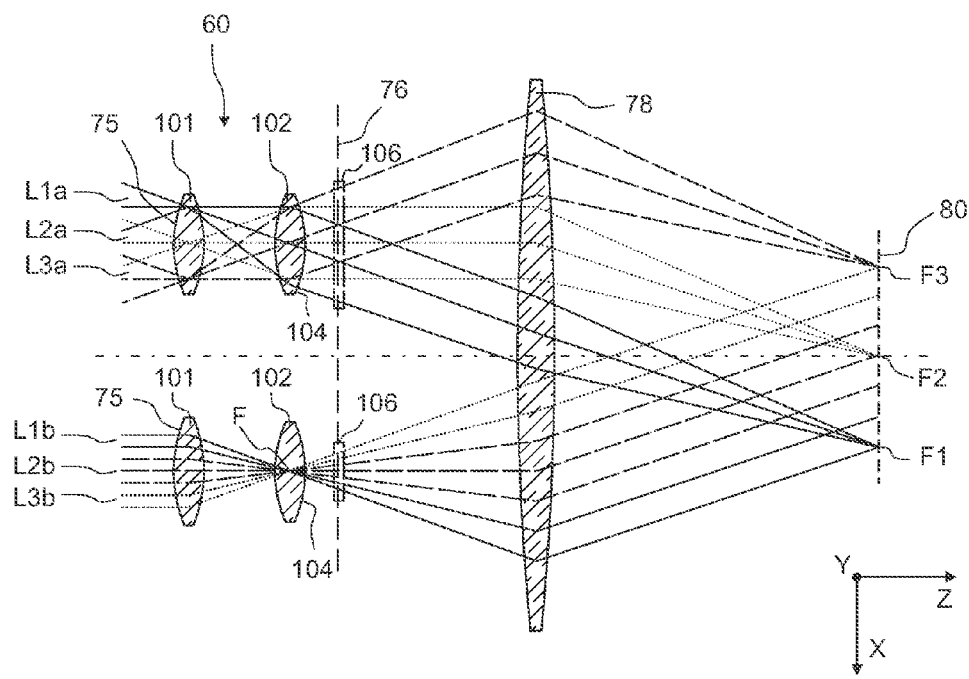
FIG. 10 is a schematic meridional section through a portion of the illumination system in which only a mirror array, a condenser and an array of optical raster elements are shown.

The lower half of FIG. 10 illustrates the case when collimated light bundles L1b, L2b and L3b impinge on different regions of the light entrance facet 75 of the first microlens 101. This is the more realistic case because the light impinging on the optical integrator 60 is usually substantially collimated. The light bundles L1b, L2b and L3b are focused in a common focal point F located in the second microlens 102 and then pass, now collimated again, the field stop plane 80. Again it can be seen that, as a result of the optical conjugation, the region where a light bundle L1b, L2b and L3b impinges on the light entrance facet 75 corresponds to the region which is illuminated in the field stop plane 80. As a matter of course, these considerations apply separately for the X and the Y direction if the microlenses 101, 102 have refractive power both along the X and Y direction.

Therefore each point on a light entrance facet 75 directly corresponds to a conjugated point in the intermediate field stop plane 80 (and hence in the illumination field 14 on the mask 16). If it is possible to selectively influence the irradiance on a point on a light entrance facet 75, it is thus possible to influence the irradiance of a light ray that impinges on the conjugated point in the illumination field 14 from a direction that depends on the position of the light entrance facet 75 with respect to the optical axis OA of the illumination system. The larger the distance between the light entrance facet 75 from the optical axis OA is, the larger is the angle under which the light ray impinges on the point on the mask 16.

3. Modifying Irradiance on Light Entrance Facets

In the illumination system 12 the spatial light modulator 52 is used to modify the irradiance on points on the light entrance facets 75. In FIG. 9 it can be seen that each pole 27 extends over a plurality of small areas that are images of the micromirrors 56. If a micromirror is brought into an "off" state, the conjugated area on the light entrance facet 75 will not be illuminated, and consequently no projection light will impinge on a conjugated area on the mask from the (small) range of directions that is associated with this particular light entrance facet 75.

This will be explained in more detail with reference to FIGS. 11a and 11b which are top views on the micromirrors 56 of the spatial light modulator 52 and on the light entrance facets 75 of the optical integrator 60, respectively.

The thick dotted lines on the second mirror array 54 divide its mirror plane 57 into a plurality of object areas 110 each including 3×3 micromirrors 56. The objective 58 forms an image of each object area 110 on the optical integrator 60. This image will be referred to in the following as image area 110'. Each image area 110' completely coincides with a light entrance facet 75, i.e. the image areas 110' have the same shape, size and orientation as the light entrance facets 75 and are completely superimposed on the latter. Since each object area 110 includes 3×3 micromirrors 56, the image areas 110' also include 3×3 images 56' of micromirrors 56.

Figures 11A, 11B:
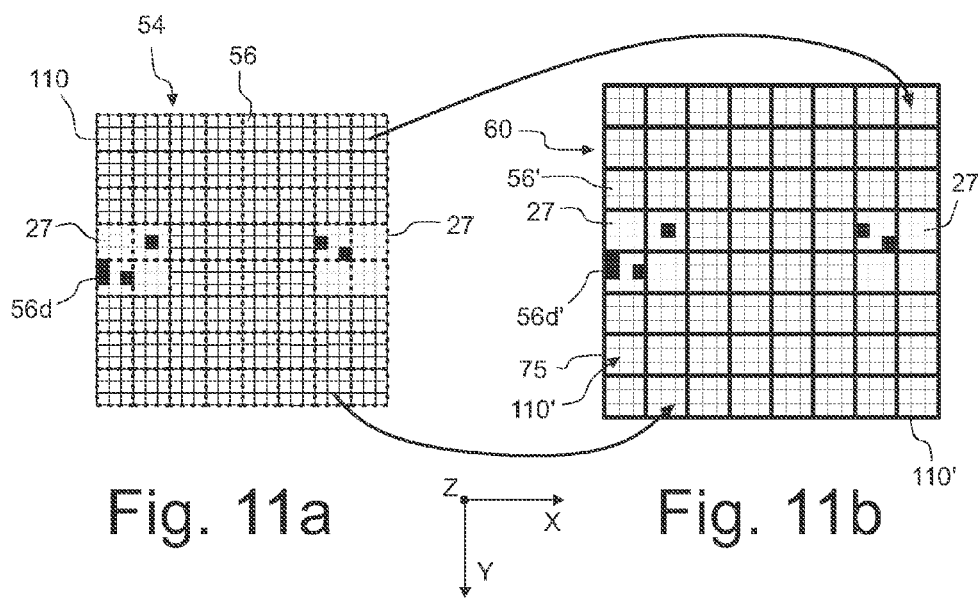
FIGS. 11a and 11b are top views on the second mirror array and the optical integrator shown in FIG. 3.

In FIG. 11a there are eight object areas 110 that are completely illuminated by the pupil forming unit 36 with projection light. These eight object areas 110 form the two poles 27. It can be seen that in some of the object areas 110 one, two or more micromirrors 56d represented as black squares have been controlled by the control unit 90 such that they are in an "off"-state in which impinging projection light is not directed towards the objective 58, but towards the absorber 62. By switching micromirrors between the "on" and the "off" state it is thus possible to variably prevent projection light from impinging on corresponding regions within the image areas 110' on the light entrance facets 75, as this is shown in FIG. 11b. These regions will be referred to in the following as dark spots 56d'.

As has been explained above with reference to FIG. 10, the irradiance distribution on the light entrance facets 75 is imaged on the field stop plane 80. If a light entrance facet 75 contains one or more dark spots 56d', as this is illustrated in the upper portion of FIG. 12, the irradiance distribution produced in the mask plane 88 by the associated optical channel will have dark spots at certain X positions, too. If a point on a mask passes through the illumination field 14, the total scan integrated irradiance will thus depend on the X position of the point in the illuminated field 14, as this is shown in the graph of FIG. 13. Points in the middle of the illumination field 14 will experience the highest scan integrated irradiance, because they do not pass through dark spots, and points at the longitudinal ends of the illumination field 14 will receive total irradiances that are reduced to different extents. Thus the field dependence of the angular light distribution on the mask 16 can be modified by selectively bringing one or more micromirrors 56 of the spatial light modulator 52 from an "on"-state into the "off"-state.

In a foregoing it has to be assumed that each object area 110, which is imaged on one of the light entrance facets 75, contains only 3×3 micromirrors 56. Thus the resolution along the cross-scan direction X that can be used to modify the field dependence of the angular light distribution is relatively coarse. If the number of micromirrors 56 within each object area 110 is increased, this resolution can be improved.

FIG. 14 illustrates a top view on one of the light entrance facets 75 for an embodiment in which 20×20 micromirrors 56 are contained in each object area 110. Then more complicated scan integrated irradiance distributions along the X direction can be achieved on the mask 16, as this is illustrated in the graph shown in FIG. 15.

4. Clipping

In the foregoing it has been assumed that the pupil forming unit 36 illuminates poles 27 on the second mirror array 54 that exactly extend over four adjacent object areas 110. Generally, however, it will be difficult to produce such an irradiance distribution with sharp edges.

The spatial light modulator 52 may also be used to clip a blurred irradiance distribution in the mirror plane 57 by bringing those micromirrors 56 into the "off"-state that lie outside the object areas 110 that shall be illuminated.

This is illustrated in FIGS. 16 and 17 in which an irradiance distribution 96 on the second mirror array 54 are shown. Here it is assumed that the movable light spots 94 produced by the mirrors 40 of the pupil forming unit 36 are superimposed to form four poles. If all micromirrors 56 of the spatial light modulator 52 are in the "on" state as shown in FIG. 16, the blurred irradiance distribution 96 would be imaged on the light entrance facets 75. If those micromirrors 56 surrounding the desired object areas 110 are brought into the "off"-state as shown in FIG. 17, they form a frame that delimits the poles and thus produces sharp edges of the intensity distribution on the light entrance facets.

5. Relative Rotation

In the embodiments described so far it has been assumed that the micromirrors 56 are aligned parallel to the borderlines of the object areas 110. The rectangular grid formed by the micromirrors 56 is then parallel to the rectangular grid which is formed by the light entrance facets 75. This results in irradiance distributions as shown in FIGS. 13 and 15 in which the irradiance along one "column" of micromirrors 56 is always uniform. Thus only stepped irradiance distributions can be produced on the light entrance facets 75.

Figure 18:
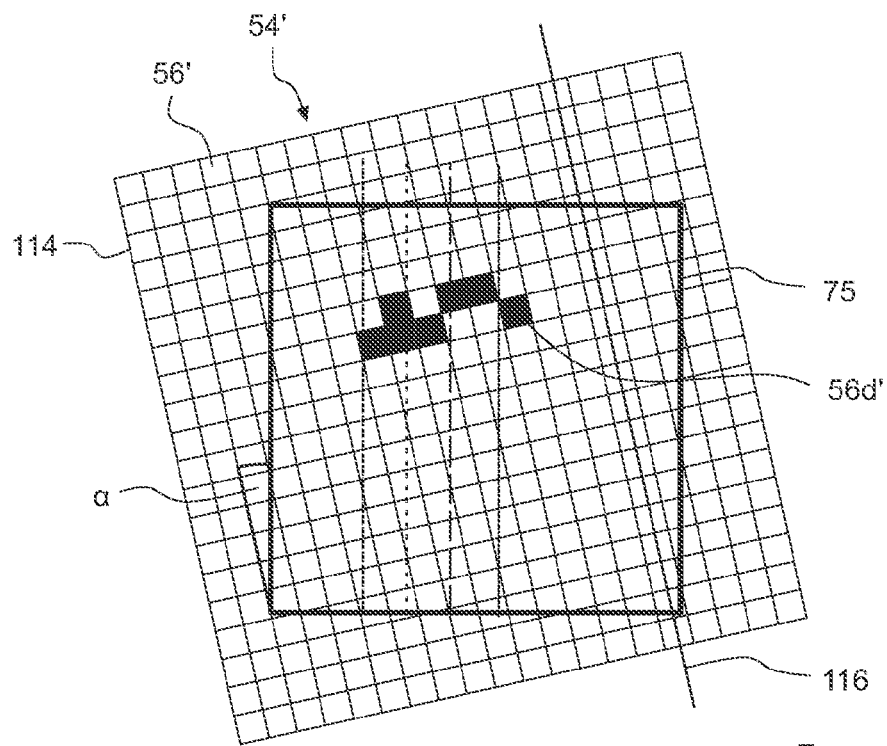
FIG. 18 is a top view on the irradiance distribution on a single light entrance facet for an alternative embodiment.

Sometimes it is desirable to produce irradiance distributions that are not stepped, but contain inclined portions. This can be achieved if the two rectangular grids are not arranged parallel to each other, but with an angle α, as this is shown in FIG. 18. Here the images 56' of the micromirrors 56 form a grid 114 which forms an angle α with the lateral sides of the light entrance facet 75. Then the centers of adjacent micromirrors 56 are aligned along a straight line having an image 116 that forms the same angle α to a boundary line of the light entrance facet 75. If this angle α is distinct from m·45° with m=0, 1, 2, 3, . . . , the irradiance distribution will not have the shape of stepped profiles as shown in FIGS. 13 and 15.

Figure 19:
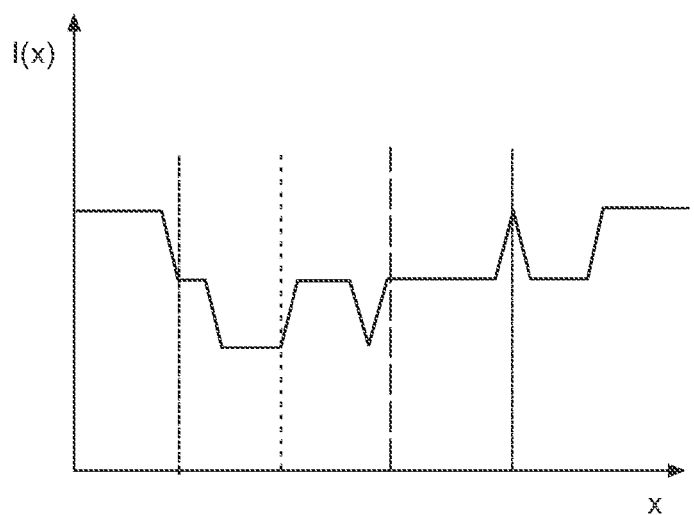
FIG. 19 is a graph showing the scan integrated irradiance distribution along the X direction produced by the light entrance facet shown in FIG. 18.

FIG. 19 is a graph that illustrates the scan integrated irradiance distribution along the X direction for the rotated arrangement shown in FIG. 18. Some particular X positions are indicated in FIG. 18 with broken lines. If the angle α is distinct from m·45° with m=0, 1, 2, 3, . . . , the degeneration is reduced so that a desired attenuation can be obtained at more different X positions. In other words, it is thus possible to effectively increase the resolution along the X direction that is available to modify the field dependence of the angular irradiance distribution.

6. Gaps—Lateral Displacement

As mentioned further above, it is usually inevitable that small gaps are formed between adjacent micromirrors 56 of the second mirror array 38. Images of these gaps are formed on the light entrance facets 75 and also on the mask 16. If these images extend parallel to the cross-scan direction X, this is of little concern because of the integrating effect that results from the scan operation. However, dark lines extending parallel to the scan direction Y could not be compensated by the integrating effect.

Figures 20A, 20B, 20C:
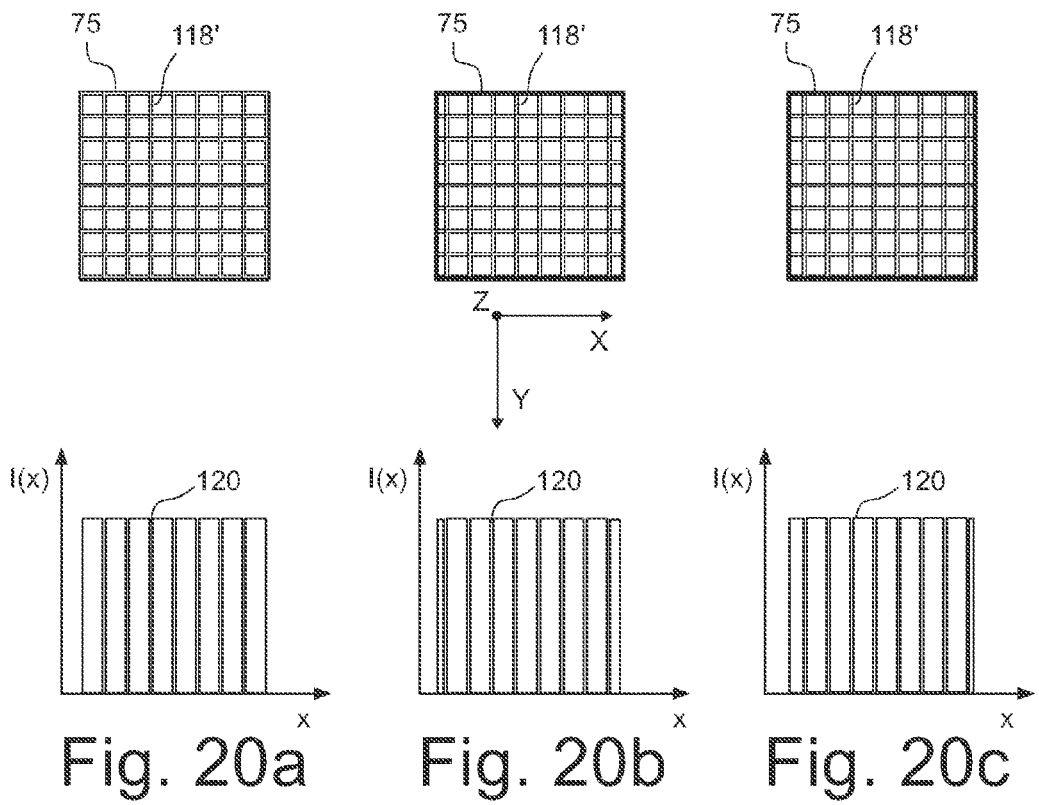
FIGS. 20a to 20c illustrate images of micromirrors on a light entrance facet and the corresponding irradiance distribution on the mask.

FIG. 20a shows in the upper portion a top view on one of the light entrance facets 75 in which the images of the gaps are denoted by 118'. The graph in the lower portion of FIG. 20a illustrates the irradiance distribution along the cross-scan direction X that is produced by this particular light entrance facet 75 in the mask plane 88. If all light entrance facets 75 would produce dark lines 120 at the same X positions, no projection light would reach points on the mask 16 at these positions.

Figure 21:
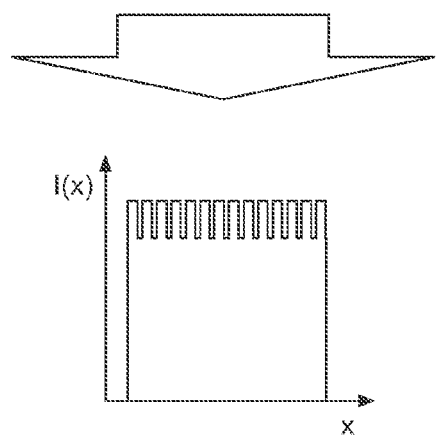
FIG. 21 is a graph showing the total irradiance distribution that is obtained by superimposing the irradiance distributions shown in FIGS. 20a to 20c.

FIGS. 20b and 20c show other light entrance facets 75 in which the gap images 118' are laterally displaced along the cross-scan direction X to different degrees. Consequently also the dark lines 120 in the irradiance distributions shown in the lower portion of these figures are laterally displaced. Since the irradiance distributions produced by each optical channel are superimposed in the mask plane 88, the dark lines 120 are averaged out, as this is shown in FIG. 21. The larger the number of light entrance facets 75 is and the smaller the dark lines 120 are, the more approximates the irradiance distribution I(x) in the mask plane 88 a uniform distribution.

6. Gaps—Scattering Plate

Alternatively or additionally, a scattering plate 122 may be arranged in an optical path between the optical light modulator 52 and the mask plane 88 in order to avoid dark lines on the mask plane 88 caused by gap images 118'. Suitable positions of the scattering plate 122 are between the optical light modulator 52 and the objective 58, between the objective 58 and the optical integrator 60, or in the vicinity of the field stop plane 80.

Figures 22, 23:
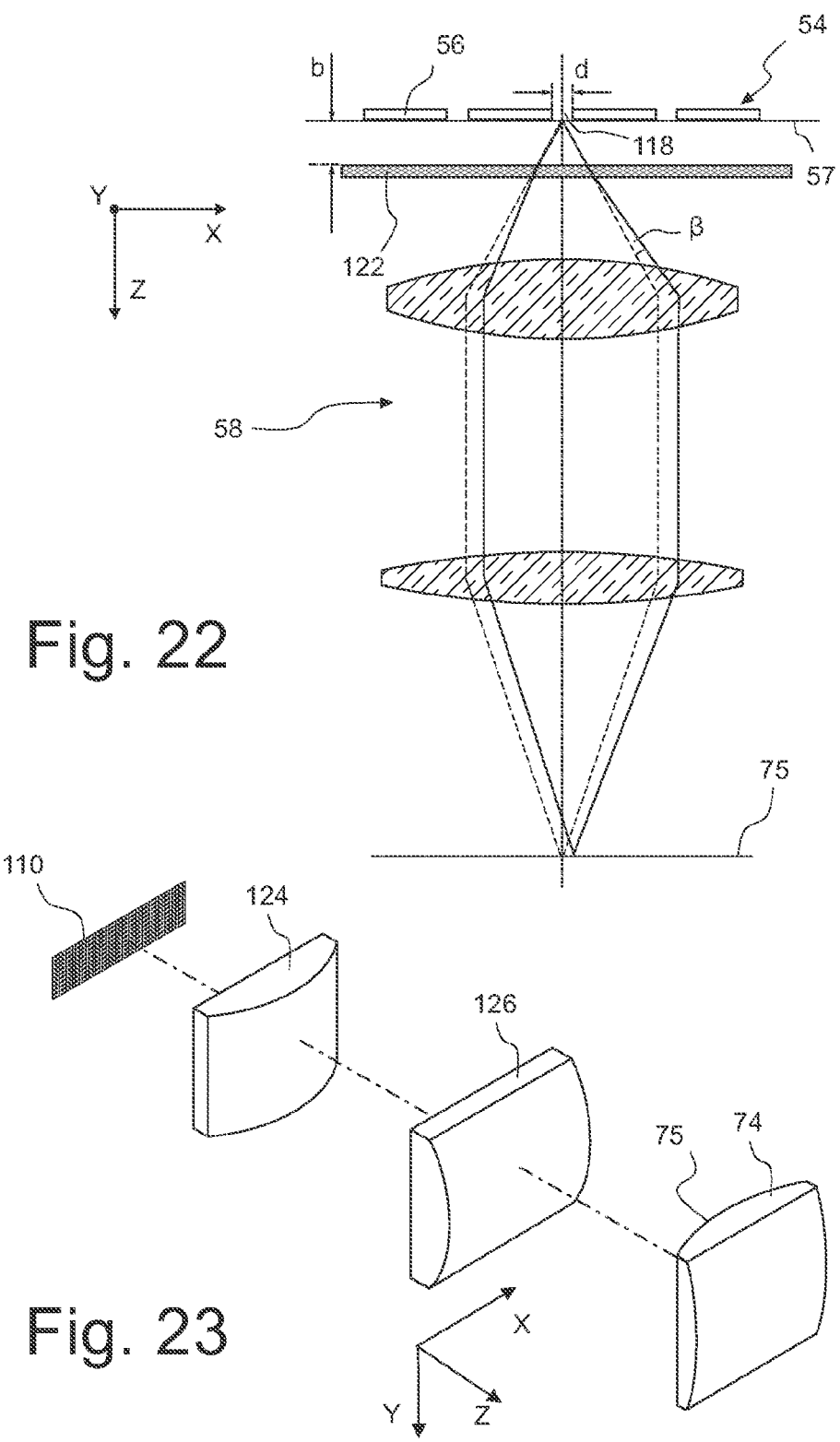
FIG. 22 is a schematic meridional section through an objective, which is contained in the illumination system shown in FIG. 3, and an additional scattering plate.
FIG. 23 is a schematic perspective view on an object area on the second mirror array, an anamorphotic objective and an optical raster element of the optical integrator.

FIG. 22 is a schematic meridional section showing several micromirrors 56 of the spatial light modulator 52, the objective 58 and the scattering plate 122 arranged in between. A gap 118 between two adjacent micromirrors 56 is assumed to have a width d, and the axial distance between the scattering plate 122 and the light exit surface 57 of the spatial light modulator 52 is denoted by b. If the characteristic scattering angle β of the scattering plate 122 is approximately d/b, the image of the gap 118 formed on the light entrance facet 75 is sufficiently blurred. If the scattering angle β is significantly larger than d/b, the desired spatial resolution for the field dependence of the irradiance and the angular irradiance distribution is reduced. If the scattering angle β is too small, the images of the gaps will still be prominent on the light entrance facets 75.

7. Rectangular Object Areas

In the embodiments described above it has been assumed that the number of micromirrors 56 along the scan direction Y and the cross-scan direction X is identical. Then a rectangular grid of square micromirrors 56 perfectly fits into a square light entrance facet 75 of the optical integrator 60.

The number $N_X$ of micromirrors 56 along the cross-scan direction X determines the resolution that is available for adjusting the field dependence of the irradiance and the angular irradiance distribution. This number should be as high as possible.

The number $N_Y$ of micromirrors 56 along the scan direction Y may be significantly smaller because of the integrating effect caused by the scan operation. Illustratively speaking, a plurality of optical channels adjacent along the scan direction Y may contribute to the reduction of the irradiance on a point on the mask 16 during a scan cycle. This does not apply to optical channels that are adjacent along the cross-scan direction X.

This suggests that the object area 110 may well be rectangular, with the length along the cross-scan direction X being larger (for example two times and preferably at least five times larger) than the length of the object area along the scan direction Y. Assuming micromirrors 56 having equal dimensions along the directions X and Y, this implies that the number $N_X$ of micromirrors 56 along the cross-scan direction X is larger than the number $N_Y$ along the scan direction Y.

If a rectangular object area 110 shall be imaged on a square light entrance facet 75, the objective 58 has to be anamorphotic. More specifically, the absolute value of the magnification M has to be smaller along the cross-scan direction X than along the scan direction Y, i.e. $|M_X|<|M_Y|$. This is illustrated in FIG. 23 in which two cylinder lenses 124, 126 of the objective 58 are arranged between a single rectangular object area 110 and the light entrance facet 75 of an optical raster element 74. If the length of the object area 110 along the cross-scan direction X is Lx and the length along the scan direction Y is $L_Y$, $|M_X/M_Y|$ should be equal to $L_Y/L_X$.

A similar result is achieved if not the objective 58, but the subsequent condenser 78 is anamorphotic so that its focal length f is different for the X and Y directions. If the objective 58 is rotational symmetric so that $M_X=M_Y$, the irradiance distributions on the light entrance facets 75 will be rectangular with the same aspect ratio $L_X/L_Y$ as the object area 110. This rectangular irradiance distribution is then expanded by the anamorphotic condenser 78 so that a square irradiance distribution is obtained in the field stop plane 80 and the subsequent mask plane 88. This approach may involve a redesign of the optical integrator 60 because the condenser's different focal lengths along the directions X, Y have to be compensated by the refractive power of the optical raster elements 74.

8. Arrangement of Mirror Plane

Figure 24:
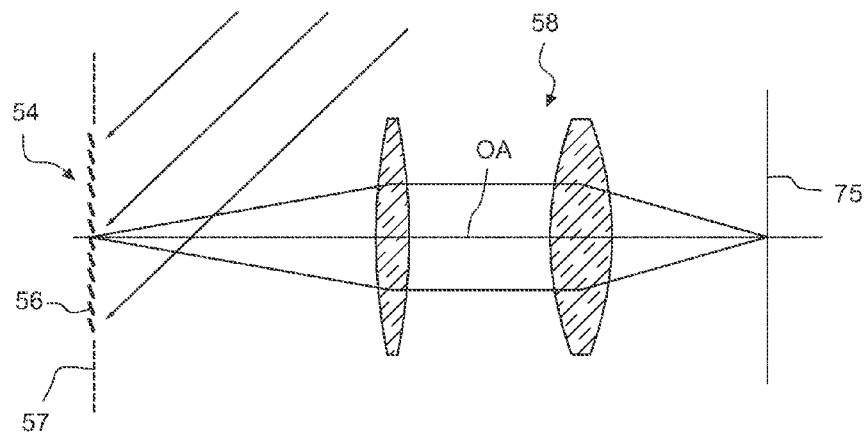
FIG. 24 is a schematic meridional section showing the second mirror array, the objective and a light entrance facet.

It is usually preferred if the chief rays of the projection light impinge perpendicularly on the optical integrator 60. Then also the mirror plane 57, which is imaged by the objective 58 on the light entrance facets 75, is arranged perpendicularly to the optical axis OA, as this is shown in FIG. 24. In such a parallel arrangement of the micromirrors 56 and the light entrance facets 75 the micromirrors 56 have to produce a deflection angle which is distinct from zero if they are in the "on"-state. This is different to conventional digital mirror devices (DMD) in which all mirror surfaces are arranged in a single plane if they are in the "on"-state.

Figure 25:
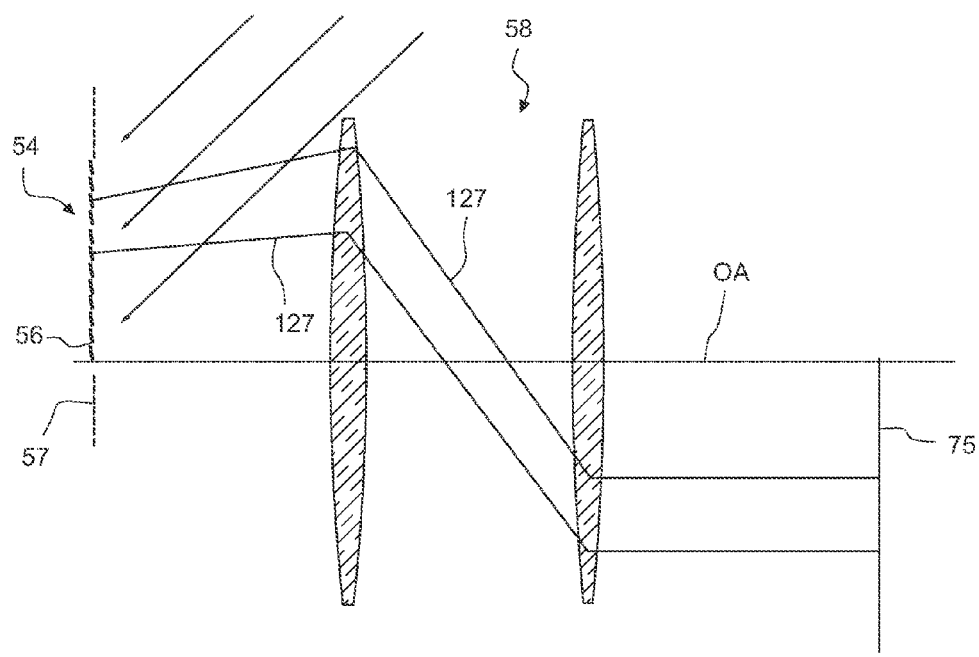
FIG. 25 shows a similar arrangement as in FIG. 24, but with an off-axis arrangement of the micromirrors and the light entrance facets.

Additionally or alternatively, the second mirror array 54 and the light entrance facets 75 may be arranged in off-axis regions of the object field and the image field of the objective 58, respectively. As it is shown in FIG. 25, it is then possible to use an objective 58 such that it is not telecentric on the object side, but telecentric on the image side. This means that chief rays forming an angle with the optical axis OA on the object side are nevertheless parallel to the optical axis OA on the image side.

9. Grouping Object Areas

If the number of micromirrors 56 in each object area 110 and also the number of optical channels (and thus of the light entrance facets 75) shall be large, the total number of micromirrors 56 in the second mirror array 54 may become huge. Since it might be difficult to provide a single second mirror array 54 that includes such a huge number of micromirrors 56, it is envisaged to split up the second mirror device into several sub-units. More specifically, the second mirror array 54 may be combined from several groups of object areas, wherein the groups are separated from each other by dark areas (i.e. an area from which no projection light emerges) that are not imaged on the light entrance facets. Each group may be realized as a single device, for example a digital mirror device (DMD).

Figure 26:
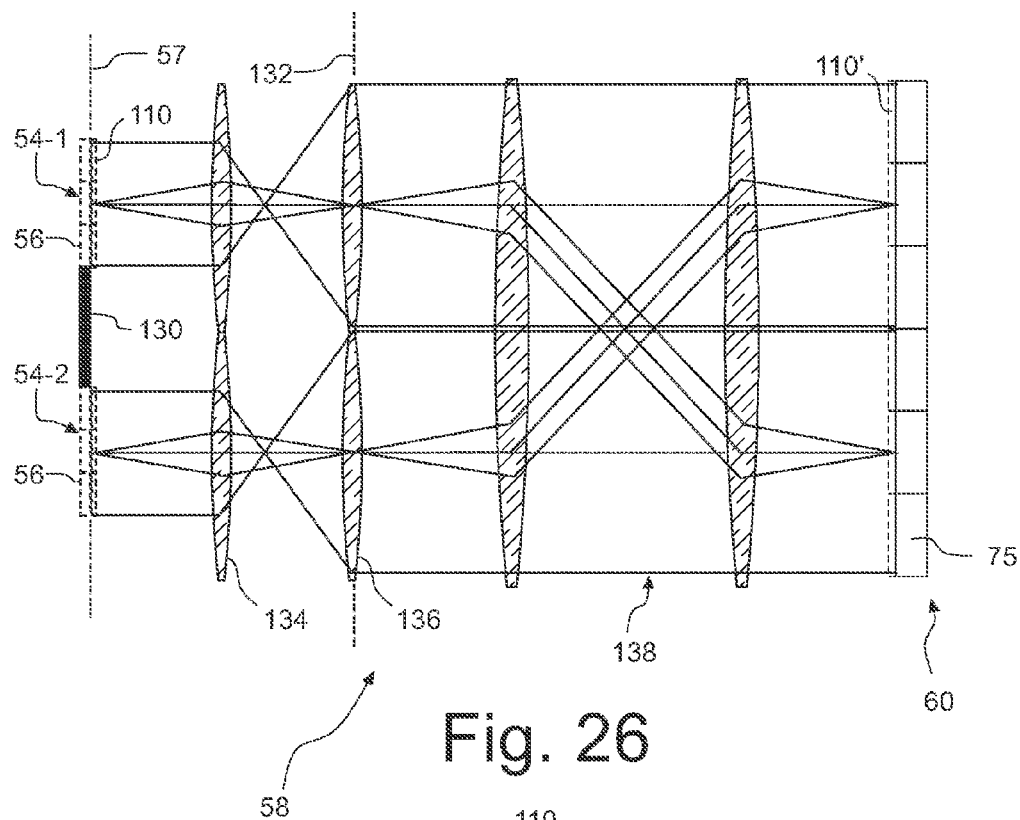
FIG. 26 is a meridional section through an embodiment in which groups of object areas are separated by a gap that is not imaged on the light entrance facets.

FIG. 26 is a schematic meridional section through the second mirror array 54 and the objective 58 according to this embodiment. It is assumed that the second mirror array 54 includes two groups 54-1, 54-2 each realized as digital mirror device (DMD). Each group 54-1, 54-2 includes three object areas 110 that extend over a plurality of micromirrors 56. The two groups 54-1, 54-2 are separated by a dark area 130 which is absorptive and on which no projection light should be directed by the pupil forming unit 36.

The objective 58 is configured to combine the images 110' of the object areas 110 so that they abut at least substantially seamlessly on the optical integrator 60. There each image area 110' completely coincides with one of the light entrance facets 75. To this end the objective 58 produces magnified images of the object areas 110 in an intermediate image plane 132 with the help of a first array of lenses 134. The objective 58 further includes an array of second lenses 136 that is arranged in the intermediate image plane 132. Common imaging optics 138 then image the intermediate image plane 134, in which the magnified images of the groups already abut, on the light entrance facets 75 of the optical integrator 60. In this way the dark areas 130 between the groups 54-1, 54-2 is not imaged by the objective 58 on the optical integrator 60.

10. Active and Passive Areas

Instead of providing a huge number of micromirrors 56 so that the light irradiance distribution on every light entrance facet 75 can be modified, it may be envisaged to modify the light irradiance distribution not on all, but only on some light entrance facets 75.

Figure 27:
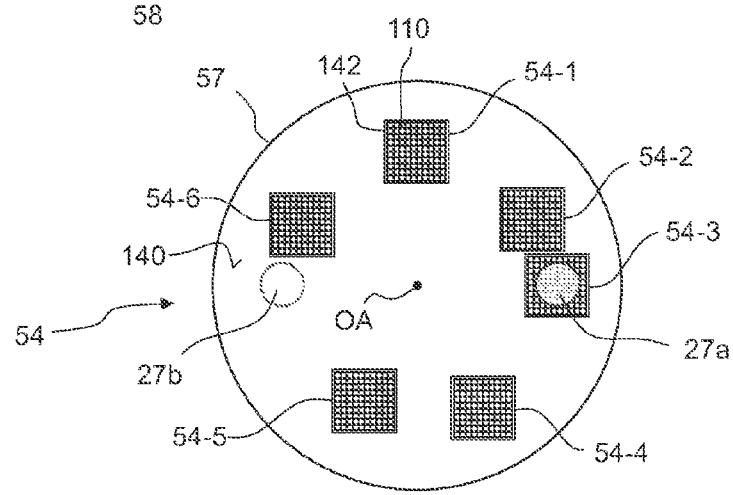
FIG. 27 is a top view on a second mirror array according to another embodiment in which the second mirror array includes passive portions.

This approach is illustrated in FIG. 27 which is a top view on the second mirror 54. Groups 54-1 to 54-6 including at least one and preferably several object areas 110 each including a plurality of micromirrors 56 are arranged within the mirror plane 57. Also in this embodiment each group may be realized as a digital mirror device (DMD). Since object areas 110 are referred to in the following as active object areas.

The entire area outside the groups 54-1 to 54-6 is configured as a plane reflective surface 140 which is provided with openings 142 in which the groups 54-1 to 54-6 are received. The reflective surface 140 may be considered as being formed as a combination of passive object areas that are also imaged on the light entrance facets 75, but in which no spatial light modulation is possible. The entire second mirror array 54 thus has the effect of a plane mirror in which the deflection angle of certain portions (namely the portions where the groups 54-1 to 54-6 are arranged) can be individually controlled.

This approach exploits the fact that it is usually not necessary to modify the irradiance distribution on every light entrance facet 75 for corrective purposes. Correction of the pole balance in the case of a dipole illumination setting, for example, involves only that the irradiance in one pole is reduced; the irradiance distribution in the other pole may remain as it is. For that reason the groups 54-1 to 54-6 are arranged point-symmetrically with respect to the optical axis OA. For any arbitrary arrangement of poles it is then possible to reduce the irradiance in a field dependent manner using the active object areas 110 contained in the group that is illuminated by one of the poles.

In this context it may be expedient to concentrate more projection light in the pole that illuminates a group with the active object areas. This pole is then used to perform the desired field dependent corrections of the irradiance and/or the angular irradiance distribution. The (albeit small) light loss which is inevitably involved in such a correction compensates the originally unbalanced illumination of the poles.

In FIG. 27 this is illustrated for two poles 27a, 27b. The pole 27a which one is located in the third group 54-3 is brighter than the other pole 27b in the passive area 140.

11. Diffractive Optical Element and LCD

Figure 28:
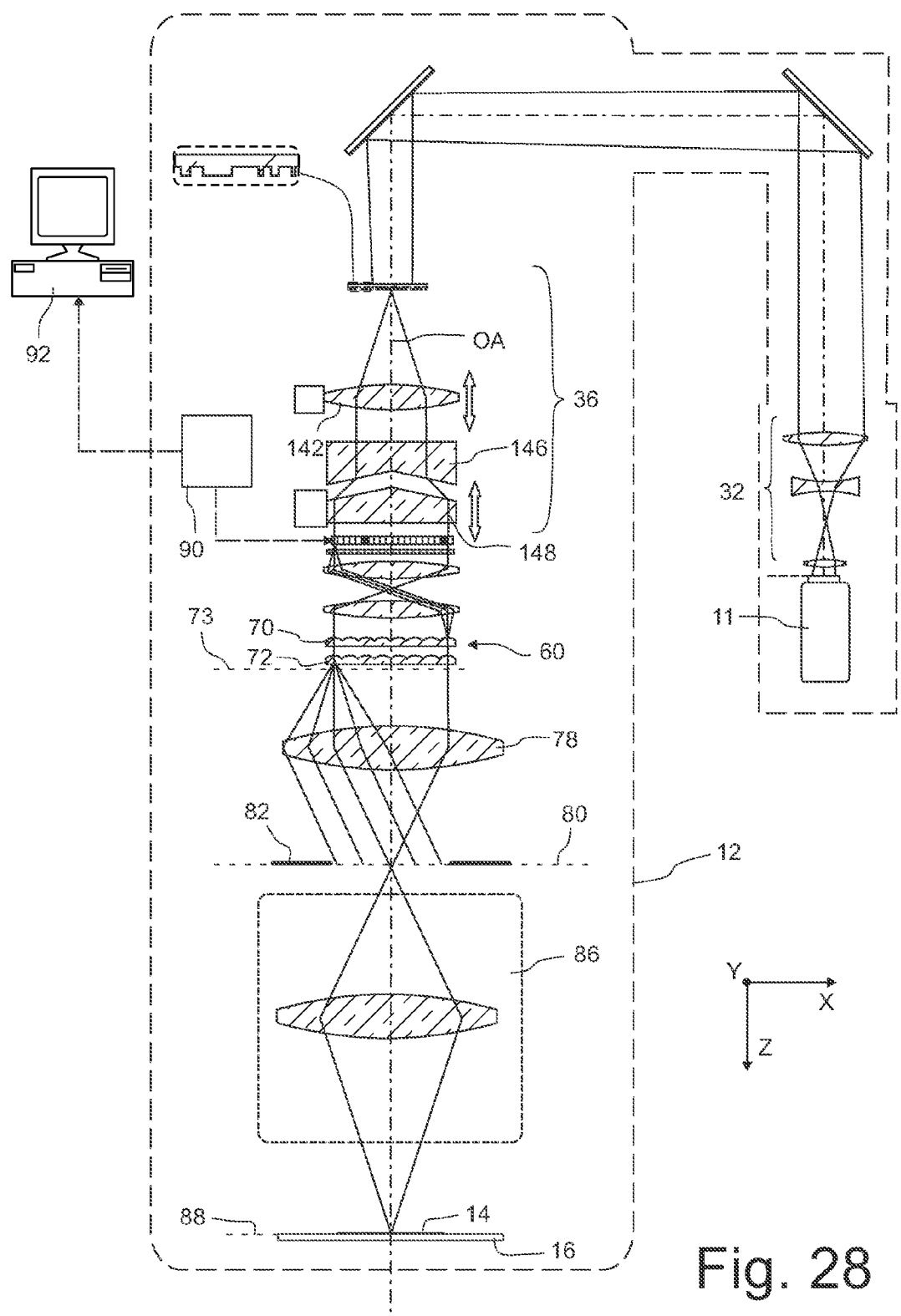
FIG. 28 is a meridional section through an illumination system according to another embodiment in which a diffractive optical element is used to define the irradiance distribution on an LCD panel used as spatial light modulator.

FIG. 28 is a meridional section similar to FIG. 3 of an alternative embodiment of an illumination system 12. In this illumination system the pupil forming unit 52 is replaced by a diffractive optical element 142, zoom optics 144 and a pair of axicon elements 146, 148.

The spatial light modulator 52 in this embodiment is formed by an LCD panel including a two dimensional array of minute LCD cells whose optical activity can be controlled individually by the control unit 90. If the projection light produced by the light source 11 is not sufficiently polarized, an additional polarizer may be inserted in the light path in front of the spatial light modulator 52.

As a matter of course, the embodiments shown in FIGS. 3 and 28 can also be combined in different ways so that, for example, a diffractive optical element 142 is used together with the second mirror array 54 as spatial light modulator 52.

V. Important Method Steps

Figure 29:
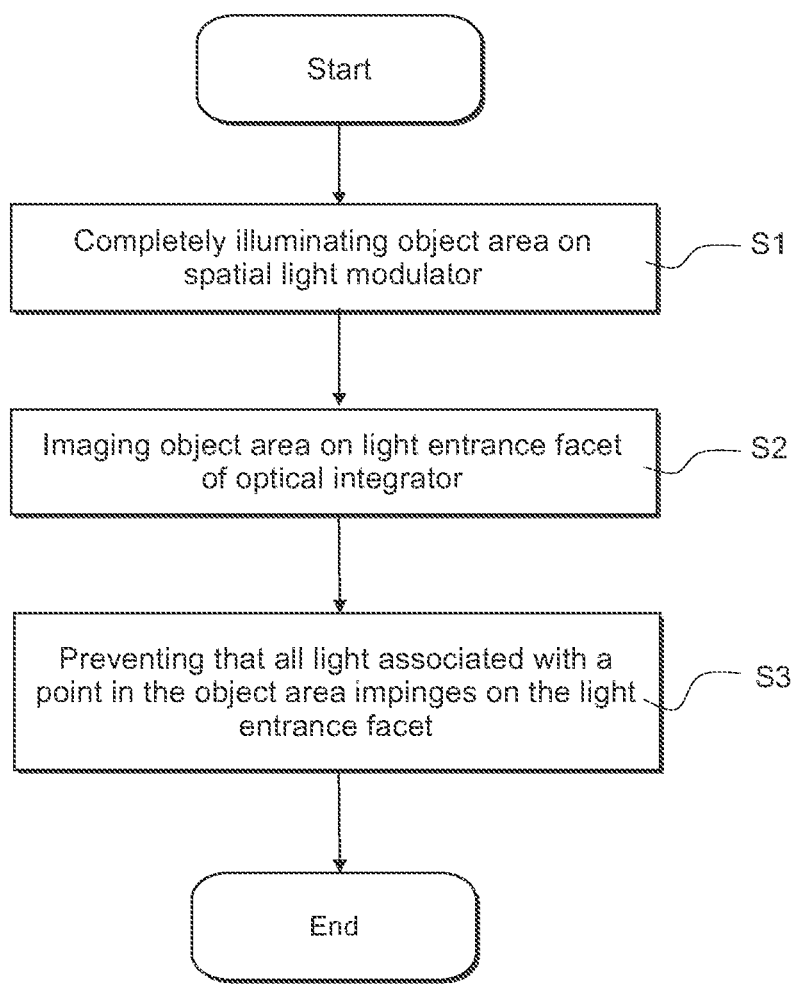
FIG. 29 is a flow diagram that illustrates important method steps.

Important method steps of the present disclosure will now be summarized with reference to the flow diagram shown in FIG. 29.

In a first step S1 an object area on a spatial light modulator is completely illuminated.

In a second step S2 the object area is imaged on a light entrance facet of an optical integrator.

In a third step S3 it is prevented that all light associated with a point in the object area impinges on the light entrance facet.

What is claimed is:

1. An illumination system, comprising:
   an optical integrator configured to produce a plurality of secondary light sources in a pupil plane, the optical integrator comprising a plurality of light entrance facets, each light entrance facet being associated with one of the secondary light sources, images of the light entrance facets being at least substantially superimposed in a mask plane;
   a spatial light modulator having a light exit surface, the spatial light modulator configured to transmit or to reflect projection light in a spatially resolved manner;
   a pupil forming unit configured to direct projection light onto the spatial light modulator;
   an objective configured to image the light exit surface of the spatial light modulator onto the light entrance facets of the optical integrator so that an image of an object area on the light exit surface has the same shape and size as one of the light entrance facets; and
   a control unit configured to control the pupil forming unit and the spatial light modulator so that: i) the object area is completely illuminated by the pupil forming unit; and ii) projection light associated with a point in the object area is at least partially and variably prevented from impinging on the one of the light entrance facets.

2. The illumination system of claim 1, wherein the pupil forming unit comprises a first beam deflection array of first reflective or transparent beam deflection elements, and each beam deflection element is configured to illuminate a spot on the spatial light modulator at a position that is variable by changing a deflection angle produced by the beam deflection element.

3. The illumination system of claim 2, wherein, during use of the illumination system, the light spots produced by the first beam deflection elements on the object area are larger than the object area.

4. The illumination system of claim 1, wherein the spatial light modulator comprises a second beam deflection array of second reflective or transparent beam deflection elements, and each second beam deflection element has: i) a first state configured to direct impinging light towards the optical integrator; and ii) a second state configured to direct impinging light elsewhere.

5. The illumination system of claim 4, wherein the second beam deflection array comprises a digital mirror device.

6. The illumination system of claim 4, wherein at least 10 second beam deflection elements are arranged in the object area.

7. The illumination system of claim 4, wherein centers of adjacent second beam deflection elements arranged in the object area are aligned along a straight line, an image of the straight line forms an angle $\alpha$ to a boundary line of the one of the light entrance facets, $\alpha$ is distinct from $m \cdot 45°$, and $m=0, 1, 2, 3, \ldots$.

8. The illumination system of claim 7, wherein boundaries of the second beam deflection elements are arranged in a first rectangular grid, boundaries of the light entrance facets are arranged in a second rectangular grid, and an image of the first rectangular grid formed on the light entrance facets forms the angle α to the second rectangular grid.

9. The illumination system of claim 4, wherein a length of the object area along a first direction is greater than a length of the object area along a second direction which is orthogonal to the first direction, the objective is an anamorphotic objective having a magnification M, and |M| is less along the first direction than along the second direction.

10. The illumination system of claim 9, wherein the second direction corresponds to a scan direction along which the mask moves while the mask is illuminated by the illumination system during use of the illumination system.

11. The illumination system of claim 4, wherein the second beam deflection elements are arranged in an object plane of the objective that is parallel to a plane in which the light entrance facets are arranged, and during use of the second beam deflection elements produce in the first state a deflection of impinging light by an angle distinct from zero.

12. The illumination system of claim 4, wherein the second beam deflection elements are arranged in an object plane of the objective that is parallel to a plane in which the light entrance facets are arranged, the objective is non-telecentric on an object side, and the objective is telecentric on an image side.

13. The illumination system of claim 4, further comprising a scattering plate in a light path between the optical light modulator and the mask plane.

14. The illumination system of claim 1, wherein at least one half of all object areas on the light exit surface of the spatial light modulator are completely illuminated by the pupil forming unit during use of the illumination system.

15. The illumination system of claim 1, wherein the object area on the light exit surface of the optical light modulator is an active object area configured to prevent projection light associated with a point in the active object area from impinging on the one of the light entrance facets, and the spatial light modulator has another object area that is a passive object area configured to avoid preventing projection light associated with a point in the passive object area from impinging on the one of the light entrance facets.

16. The illumination system of claim 15, wherein, during use of the illumination system, the irradiance produced on the spatial light modulator by the pupil forming unit is higher on the active object area than on the passive object area.

17. The illumination system of claim 15, wherein the passive object area and the active object area are arranged point-symmetrically to each other with respect to an optical axis of the illumination system.

18. The illumination system of claim 17, wherein the optical light modulator comprises a plurality of active object areas and a plurality of passive object areas, and each passive object area is arranged point-symmetrically to one of the active object areas.

19. The illumination system of claim 18, wherein the objective comprises:
   a first array of first optical elements, each first optical element configured to form a magnified image of one of the groups in an intermediate image plane; and
   imaging optics configured to image the intermediate image plane on the light entrance facets.

20. The illumination system of claim 1, wherein the light exit surface of the optical light modulator comprises groups of object areas that are separated by areas that are not imaged on the light entrance facets, and the objective is configured to combine images of the object areas so that the images of the object areas abut on the optical integrator.

21. The illumination system of claim 1, wherein the image of the object area on the light exit surface has the same orientation as the one of the light entrance facets.

22. A method, comprising:
   producing an irradiance distribution of projection light on a spatial light modulator that has a light exit surface and is configured to transmit or reflect projection light in a spatially resolved manner, the light exit surface comprising an object area that is completely illuminated by projection light;
   imaging the object area on the light exit surface on a light entrance facet of an optical integrator so that an image of the object area has the same shape and size as the light entrance facet; and
   controlling the spatial light modulator so that projection light associated with a point in the object area is at least partially prevented from impinging on the light entrance facet.

23. The method of claim 22, wherein the image of the object area has the same orientation as the light entrance facet.

24. An illumination system, comprising:
   an optical integrator configured to produce a plurality of secondary light sources in a pupil plane, the optical integrator comprising a plurality of light entrance facets, each light entrance facet being associated with one of the secondary light sources;
   a spatial light modulator having a light exit surface, the spatial light modulator configured to transmit or to reflect impinging projection light in a spatially resolved manner;
   a pupil forming unit configured to direct projection light on the spatial light modulator;
   an objective configured to image the light exit surface of the spatial light modulator onto the light entrance facets of the optical integrator so that an image of an object area on the light exit surface has the same shape and size as one of the light entrance facets; and
   a control unit configured to control the pupil forming unit and the spatial light modulator so that the object area is completely illuminated by the pupil forming unit.

25. The illumination system of claim 24, wherein the image of the object area on the light exit surface has the same orientation as the one of the light entrance facets.

26. An illumination system, comprising:
   a pupil forming unit configured to direct light on a spatial light modulator that is configured to transmit or to reflect impinging light in a spatially resolved manner;
   an objective configured to image a light exit surface of the spatial light modulator onto light entrance facets of an optical integrator so that an image of an object area on the light exit surface has the same shape and size as one of the light entrance facets; and
   a control unit configured to control the pupil forming unit and the spatial light modulator so that: i) the object area is completely illuminated by the pupil forming unit; and ii) projection light associated with a point in the object area is at least partially and variably prevented from impinging on the one of the light entrance facets.

27. The illumination system of claim 26, wherein the image of the object area on the light exit surface has the same orientation as the one of the light entrance facets.

* * * * *

UNITED STATES PATENT AND TRADEMARK OFFICE
CERTIFICATE OF CORRECTION

PATENT NO. : 9,910,359 B2  
APPLICATION NO. : 15/086475  
DATED : March 6, 2018  
INVENTOR(S) : Markus Deguenther et al.

Page 1 of 1

It is certified that error appears in the above-identified patent and that said Letters Patent is hereby corrected as shown below:

In the Specification

Column 5, Line 59: Delete "a" and insert -- $\alpha$ --, therefor.

Column 18, Line 62: Delete "6." and insert -- 7. --, therefor.

Column 19, Line 56: Delete "Lx" and insert -- $L_X$ --, therefor.

Signed and Sealed this
Twelfth Day of June, 2018

Andrei Iancu
*Director of the United States Patent and Trademark Office*